United States Patent
Kikuchi et al.

(10) Patent No.: US 8,384,167 B2
(45) Date of Patent: Feb. 26, 2013

(54) SEMICONDUCTOR DEVICE WITH FIELD EFFECT TRANSISTOR AND MANUFACTURING METHOD THEREOF

(75) Inventors: Yoshiaki Kikuchi, Kanagawa (JP); Hitoshi Wakabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 129 days.

(21) Appl. No.: 12/858,029

(22) Filed: Aug. 17, 2010

(65) Prior Publication Data

US 2011/0042758 A1 Feb. 24, 2011

(30) Foreign Application Priority Data

Aug. 24, 2009 (JP) ................. 2009-193353

(51) Int. Cl.
*H01L 29/78* (2006.01)
(52) U.S. Cl. ............. 257/408; 438/309; 257/E29.266
(58) Field of Classification Search ............ 257/408, 257/E29.256, 288, 437, 369, 371; 438/299, 438/309
See application file for complete search history.

(56) References Cited

U.S. PATENT DOCUMENTS

| | | | | |
|---|---|---|---|---|
| 6,815,279 B2* | 11/2004 | Yagishita et al. | | 438/199 |
| 7,704,844 B2* | 4/2010 | Zhu et al. | | 438/302 |
| 7,723,750 B2* | 5/2010 | Zhu et al. | | 257/192 |
| 7,883,976 B2* | 2/2011 | Zhu et al. | | 438/289 |
| 7,989,901 B2* | 8/2011 | Lin et al. | | 257/408 |
| 2004/0124479 A1* | 7/2004 | Takeshi | | 257/408 |
| 2005/0093034 A1* | 5/2005 | Miles | | 257/288 |
| 2006/0097318 A1* | 5/2006 | Li | | 257/347 |
| 2006/0226447 A1* | 10/2006 | Iinuma | | 257/202 |
| 2009/0090979 A1* | 4/2009 | Zhu et al. | | 257/408 |
| 2009/0152646 A1* | 6/2009 | Zhu et al. | | 257/408 |
| 2009/0152648 A1* | 6/2009 | Cho | | 257/408 |

FOREIGN PATENT DOCUMENTS

| | | |
|---|---|---|
| JP | 03-280437 | 12/1991 |
| JP | 05-112491 | 5/1993 |
| JP | 2001-291864 | 10/2001 |
| JP | 2004-039762 | 2/2004 |
| JP | 2005-209980 | 8/2005 |

* cited by examiner

*Primary Examiner* — Nathan Ha
(74) *Attorney, Agent, or Firm* — SNR Denton US LLP

(57) ABSTRACT

A semiconductor device includes: a semiconductor substrate in which a SiGe layer having a first width in a channel direction is embedded in a channel forming region; gate insulating film formed on the channel forming region; a gate electrode formed on the gate insulating film and having a region protruding from a forming region of the SiGe layer with a second width wider than the first width; and source/drain regions having extension regions formed on the semiconductor substrate which sandwiches the channel forming region, thereby forming a field effect transistor, wherein the extension region is apart from the SiGe layer so that a depletion layer extending from a junction surface between the extension region and the semiconductor substrate does not reach the SiGe layer.

15 Claims, 35 Drawing Sheets

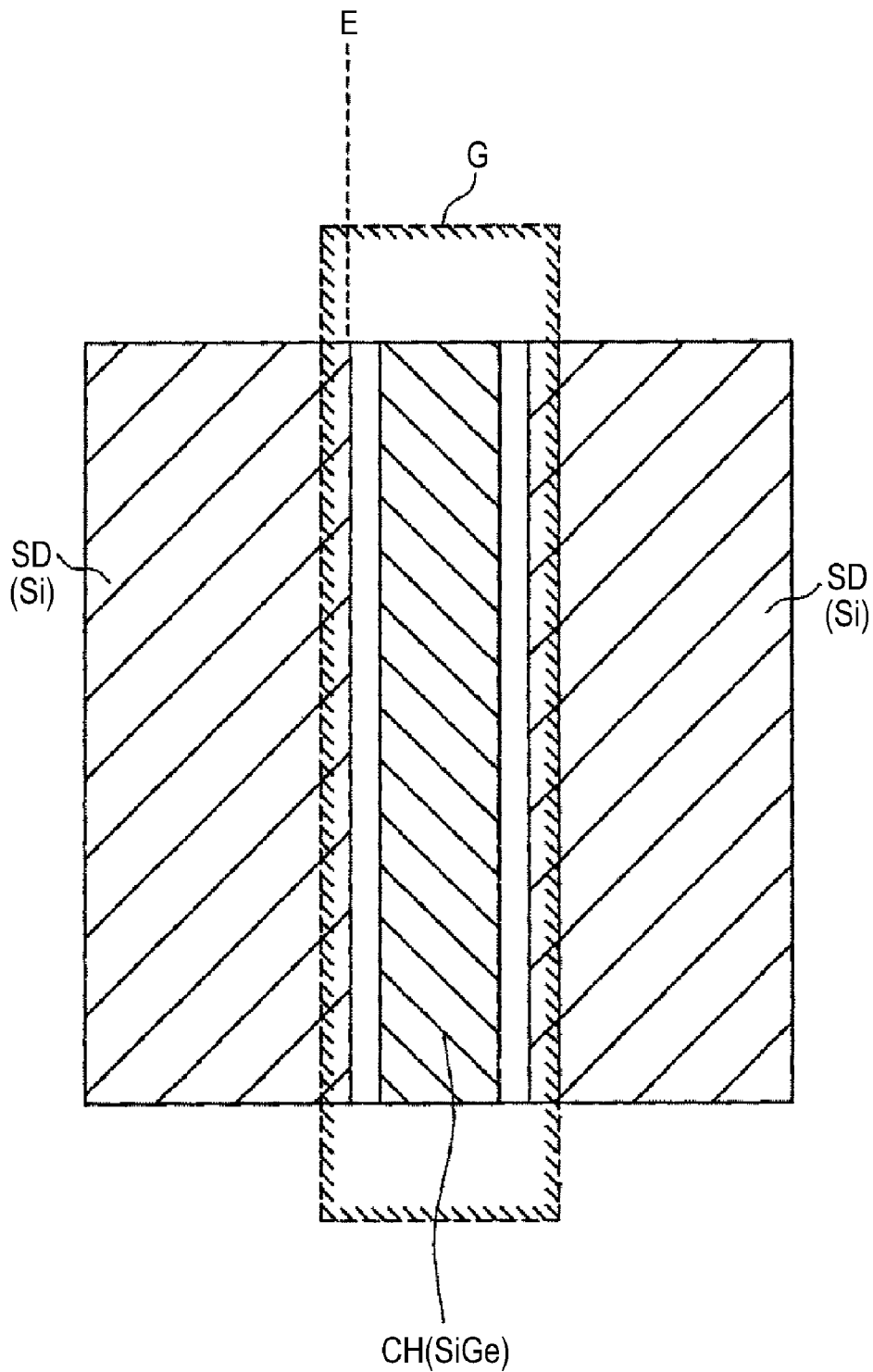

SEMICONDUCTOR DEVICE WITH FIELD EFFECT TRANSISTOR AND MANUFACTURING METHOD THEREOF

BACKGROUND OF THE INVENTION

1. Field of the Invention

The present invention relates to a semiconductor device and a manufacturing method thereof, and particularly relates to a semiconductor device and a manufacturing method thereof including a field effect transistor.

2. Description of the Related Art

In recent years, technical barriers to reduce a gate length of the field effect transistor are increasing. In order to alleviate the situation, attention is focused on high mobility channel materials, for example, strained Si, SiGe, Ge and the like. Additionally, it is known that, when the gate length is reduced, speed of carrier injection at a source end is more important rather than carrier mobility in operation speed of the transistor.

In a transistor disclosed in JP-A-2004-39762 (Patent Document 1), with regard to the source end, when carriers are moved from a Si-layer region to a $Si_{1-x}Ge_x$ (x=0 to 1) layer region, a band gap between a conductor and a valence band is narrowed and thereby speed of carrier injection is increased. Patent Document 1 discloses that operation speed of the transistor can be improved as a result of the increase of carrier injection speed even when the gate length is short.

The transistor having the same structure is disclosed also in JP-A-2005-209980 (Patent Document 2). In Patent Document 2, extensions and deep source/drain regions are made of the Si layer because it is difficult to control impurity diffusion when the channel and the source/drain regions are all made of SiGe. Patent Document 2 discloses that channel mobility can be improved while maintaining controllability of impurity diffusion in the source/drain regions according to the structure.

In a transistor disclosed in JP-A-3-280437 (Patent Document 3), a SiGe layer is formed in the Si layer by Ge ion implantation, and the channel region has a structure in which a gate oxide film, the Si layer and the SiGe layer are stacked. According to the structure, carriers are moved in the SiGe layer having the narrow band gap and high mobility while forming the uniform gate oxide film, thereby improving transistor characteristics. This is a so-called SiGe channel transistor.

In JP-A-5-112491 (Patent Document 4), a double-gate transistor is disclosed, in which carrier are moved in SiGe. This is also the SiGe channel transistor similar to the Patent Document 3.

A transistor disclosed in Jp-A-2001-291864 (Patent Document 5) improves CMOS characteristics by forming tensile strained SiGe in the channel region and improving drive current of an NMOS and a PMOS in a balanced manner. The transistor disclosed in Patent Document 5 is also the SiGe channel transistor.

In the case of tensile Si, drive current is improved 1.7 times in the NMOS and 1.4 times in the PMOS as much as the drive current in the MOSFET made of Si. As a result, unbalance between the NMOS and the PMOS further increases. Therefore, it is necessary to improve the rate of improvement in drive current of the PMOS. The rate of improvement in mobility is higher than the tensile Si in a region having higher Ge concentration when using the tensile SiGe, therefore, the CMOS characteristics can be improved.

However, the transistor disclosed in Patent Document 1 has a structure in which the SiGe region is extended to ends of the gate. Normally, an extension impurity is designed so as to enter the inside of the gate to form overlap regions. That is, in the transistor structure of Patent Document 1, junctions of the source/drain are formed in the SiGe region, therefore, it is difficult to suppress junction leakage due to the narrower band gap as compared with Si. As a result, the junction leakage leads to increase of off-leakage current and characteristics as an LSI will deteriorate.

The transistor of Patent Document 2 has a structure in which the gate is arranged to the outside of the SiGe region formed in advance so that impurities do not enter the SiGe region in the light of controllability of impurity profiles. In Patent Document 2, a depletion layer of the extension may enter the SiGe region. In this regard, the junction leakage similar to Patent Document 1 may occur. Additionally, the gate is formed after the SiGe region is formed in the process, therefore, the process is not self aligned. As a result, the source/drain junctions are not always formed outside the SiGe region and the junction leakage may occur in the same manner as Patent Document 1.

In the cases of Patent Documents 3 to 5, as whole the source/drain regions are SiGe regions, the transistor has a structure in which the junction leakage is more likely to occur than Patent Document 1, which may leads to increase of off-leakage current.

SUMMARY OF THE INVENTION

It is desirable to provide a transistor capable of realizing improvement of carrier mobility and increase of carrier speed in the channel while suppressing junction leakage.

According to an embodiment of the invention, there is provided a semiconductor device including a semiconductor substrate in which a SiGe layer having a first width in a channel direction is embedded in a channel forming region, gate insulating film formed on the channel forming region, a gate electrode formed on the gate insulating film and having a region protruding from a forming region of the SiGe layer with a second width wider than the first width and source/drain regions including extension regions formed on the semiconductor substrate which sandwiches the channel forming region, thereby forming a field effect transistor, in which the extension region is apart from the SiGe layer so that a depletion layer extending from a junction surface between the extension region and the semiconductor substrate does not reach the SiGe layer.

In the semiconductor device according to the embodiment of the invention, the SiGe layer having the first width in the channel direction is embedded in the channel forming region of the semiconductor substrate, the gate insulating film is formed on the channel forming region, the gate electrode having the region protruding from the forming region of the SiGe layer is formed on the gate insulating film with the second width wider than the first width, and the source/drain regions having extension regions on the semiconductor substrate which sandwiches the channel forming region to thereby form the field effect transistor.

Here, the extension region is apart from the SiGe layer so that the depletion layer extending from the junction surface between the extension region and the semiconductor substrate does not reach the SiGe layer.

According to another embodiment of the invention, there is provided a manufacturing method of a semiconductor device including the steps of forming a dummy gate insulating film and a dummy gate electrode on a semiconductor substrate including a channel forming region, forming offset spacers at both sides of the dummy gate electrode, forming extension regions on the semiconductor substrate by using the offset spacers and the dummy gate electrode as masks, forming sidewall spacers at both sides of the offset spacers, forming source/drain regions on the semiconductor substrate by using the sidewall spacers, the offset spacers and the dummy gate electrode as masks, forming an insulating film covering the dummy gate electrode, removing the insulating film until the dummy gate electrode is exposed from an upper surface of the insulating film, forming a groove for an gate electrode by removing the dummy gate electrode and the dummy gate insulating film, forming a concave portion for embedding a SiGe layer on a surface of the semiconductor substrate at a bottom of the groove for the gate electrode, forming the SiGe layer having a first width in a channel direction in the concave portion for embedding the SiGe layer, removing the offset spacers, forming a gate insulating film on the SiGe layer at the bottom of the groove for the gate electrode from which the offset spacers were removed and forming the gate electrode having a second width wider than the first width at a region protruding from the SiGe layer on the gate insulating film so as to fill in the groove for the gate electrode, thereby forming a field effect transistor, in which, in the step of forming the SiGe layer, the extension region and the SiGe layer are formed to be apart from each other so that a depletion layer extending from a junction surface between the extension region and the semiconductor substrate does not reach the SiGe layer.

In the manufacturing method of the semiconductor device according to the embodiment of the invention, the dummy gate insulating film and the dummy gate electrode are formed on the semiconductor substrate including the channel forming region, the offset spacers are formed at both sides of the dummy gate electrode, the extension regions are formed on the semiconductor substrate by using the offset spacers and the dummy gate electrode as masks, the sidewall spacers are formed at both sides of the offset spacers and the source/drain regions are formed on the semiconductor substrate by using the sidewall spacers, the offset spacers and the dummy gate electrode as masks.

Next, the insulating film covering the dummy gate electrode is formed, the insulating film is removed until the dummy gate electrode is exposed from the upper surface of the insulating film and the groove for the gate electrode is formed by removing the dummy gate electrode and the dummy gate insulating film.

Next, the concave portion for embedding the SiGe layer is formed on the surface of the semiconductor substrate at the bottom of the groove for the gate electrode, the SiGe layer having the first width in a channel direction is formed in the concave portion for embedding the SiGe layer, the offset spacers are removed and the gate insulating film is formed on the SiGe layer at the bottom of the groove for the gate electrode from which the offset spacers were removed and the gate electrode having the second width wider than the first width at the region protruding from the SiGe layer on the gate insulating film so as to fill in the groove for the gate electrode.

In the manner as described above, the field effect transistor is formed.

Here, in the step of forming the SiGe layer, the extension region and the SiGe layer are formed to be apart from each other so that the depletion layer extending from the junction surface between the extension region and the semiconductor substrate does not reach the SiGe layer.

The semiconductor device according to the embodiment of the invention is capable of realizing improvement of carrier mobility as well as increase of carrier speed in the channel in the MOS field effect transistor while suppressing junction leakage.

The manufacturing method of the semiconductor device according to the embodiment of the invention can form the MOS field effect transistor capable of realizing improvement of carrier mobility as well as increase of carrier speed in the channel in the MOS field effect transistor while suppressing junction leakage.

BRIEF DESCRIPTION OF THE DRAWINGS

FIG. 1 is a schematic plan view of a semiconductor device according to a first embodiment of the invention;

DESCRIPTION OF THE PREFERRED EMBODIMENTS

Figure 2A:
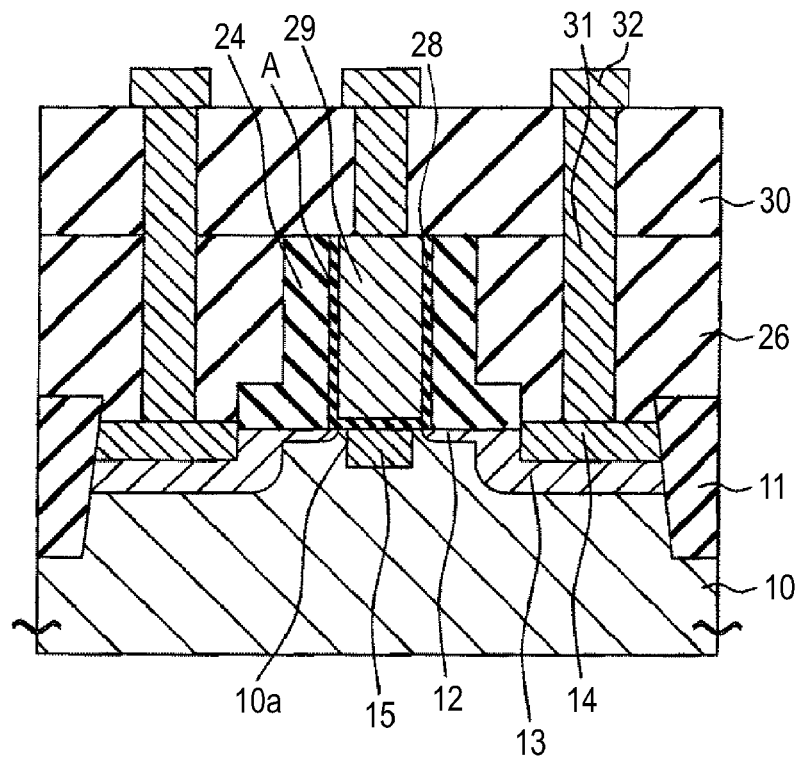
FIG. 2A is a cross-sectional view of the semiconductor device according to the first embodiment and FIG. 2B is an enlarged view of a part of FIG. 2A.

Hereinafter, embodiment of a semiconductor device and a manufacturing method thereof in the invention will be explained with reference to the drawings.

The explanation will be made in the following order.

1. First Embodiment (Whole structure of embodiments of the invention)

2. Second Embodiment (Structure in which a gate electrode is made of refractory metal silicide and polysilicon 3. Third Embodiment (Structure in which the width of a SiGe layer in a channel direction becomes wider as the depth becomes deeper from the substrate surface)

4. Fourth Embodiment (Structure in which Ge concentration is increased from an end portion on the side of source/drain regions toward the central direction of the SiGe layer)

5. Fifth Embodiment (Structure in which an upper surface of the SiGe layer has a convex portion and Ge concentration is increased from a portion embedded in a semiconductor substrate toward the convex portion direction)

6. Sixth Embodiment (Structure in which SiGe layers for source/drain are embedded in a surface layer portion of the source/drain regions)

7. Seventh Embodiment (Structure in which a Si layer and a SiGe layer are formed in a concave portion for the SiGe layer)

8. Eight embodiment (Structure in which materials for gate electrodes are different in a CMOS)

9. Ninth embodiment (Structure in which tensile strain is applied to an NMOS in the CMOS)

First Embodiment

[Layout of a Semiconductor Device]

FIG. 1 is a schematic plan view of a semiconductor device according to the embodiment. The semiconductor device according to the embodiment is a P-channel type MOS field effect transistor (referred to as a PMOS in the following description).

In a semiconductor substrate made of n-type silicon (Si) or an n-well of the semiconductor substrate, an n-type SiGe layer having a first width in a channel direction is embedded in a channel forming region CH.

A gate insulating film is formed on the channel forming region and a gate electrode G having a region protruding from the forming region of the SiGe layer is formed with a second width wider than the first width.

P-type source/drain regions SD having p-type extension regions are formed on the semiconductor substrate sandwiching the channel forming region CH. In the drawing, the source/drain regions having extension regions are not discriminated.

In the manner as described above, the PMOS is formed.

In the semiconductor device according to the embodiment, the extension region and the SiGe layer are apart from each other so that a depletion layer extending from a junction surface between the extension region and the semiconductor substrate included in the source/drain region SD does not reach the SiGe layer. In the drawing, an end E of the extension region included in the source/drain region SD on the side of the channel forming region is sufficiently apart from the SiGe layer, which represents a layout in which the depletion layer does not reach the SiGe layer.

[Cross-Sectional Structure of the Semiconductor Device]

Figure 2B:
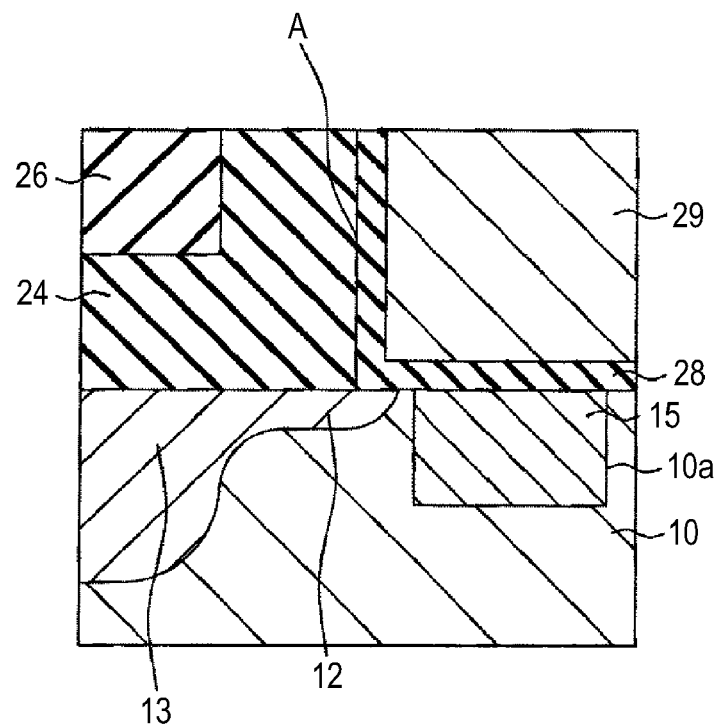

FIG. 2A is a cross-sectional view of the semiconductor device according to the embodiment and FIG. 2B is an enlarged view of a part in the vicinity of the extension region, the gate electrode and the SiGe layer, which is the part of FIG. 2A.

For example, an element isolation insulating film 11 by a STI (shallow trench isolation) method isolating an active region is formed in a semiconductor substrate 10 made of n-type silicon (Si) having the channel forming region or an n-well of the semiconductor substrate 10. A concave portion for embedding the SiGe layer 10a is formed in the channel forming region of the semiconductor substrate 10, and an n-type SiGe layer 15 having the first width in the channel direction is embedded therein.

Also, for example, in regions sandwiching a region of the SiGe layer 15 to be the channel forming region, a pair of sidewall spacers 24 made of a silicon nitride film and the like are formed on the semiconductor substrate 10.

For example, the region between the pair of sidewall spacers 24 is a groove for the gate electrode "A". A gate insulating film 28 made of a so-called High-k film having a dielectric constant higher than silicon oxide such as hafnium oxide or aluminum oxide is formed so as to cover an inner wall surface of the groove for the gate electrode "A" including the bottom thereof.

For example, agate electrode 29 made of metal materials and the like is formed so as to be embedded in the groove for the gate electrode "A" over the gate insulating film 28. The gate electrode 29 is made of a metal selected from groups including tungsten, hafnium, tantalum, titanium, molybdenum, ruthenium, nickel and platinum, an alloy including these metals or a chemical compound of these metals.

Additionally, for example, p-type source/drain regions 13 including p-type extension regions 12 are formed at regions sandwiching the SiGe layer 15 to be the channel forming region including at least parts under the sidewall spacers 24 on the semiconductor substrate 10.

Refractory metal silicide layers 14 made of NiSi and so on are formed at surface layer portions of the source/drain regions 13.

In the manner as described above, the PMOS is formed.

Moreover, a first interlayer insulating film 26 and a second interlayer insulating film 30 made of silicon oxide are stacked so as to cover the PMOS.

Openings reaching the refractory metal silicide layers 14 connected to the source/drain regions 13 and the gate electrode 29 are formed so as to pierce through the first interlayer insulating film 26 and the second interlayer insulating film 30, and plugs 31 made of a conductive material such as metal are buried therein. Upper wiring 32 made of a conductive material is formed over the second interlayer insulating film 30 so as to connect to the plugs 31.

In the present embodiment, the extension region 12 has, for example, an overlap region entering beneath the gate electrode 29 as shown in FIG. 2B.

[Explanation of Energy Bands]

The semiconductor device according to the embodiment of the invention can realize improvement of carrier mobility as well as increase of carrier speed in the channel in the MOS field effect transistor.

Figure 3:
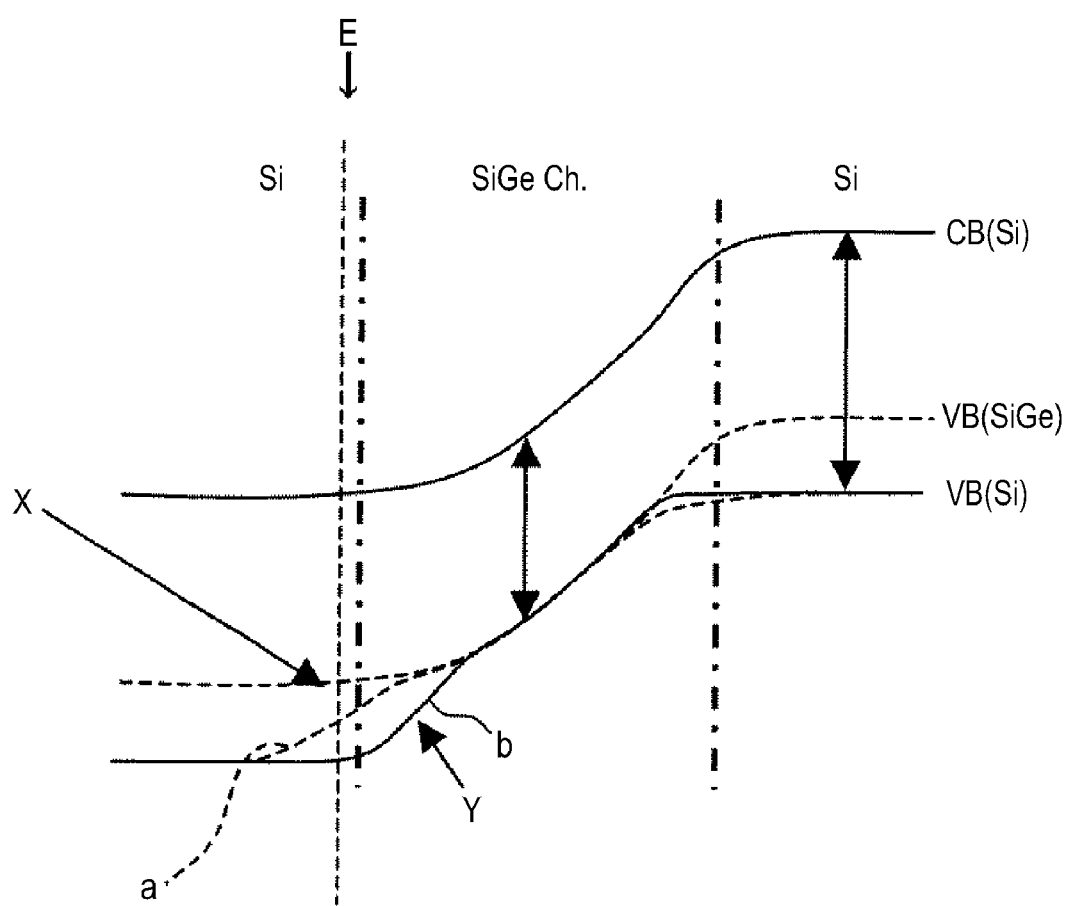
FIG. 3 is a view showing energy bands of the semiconductor device according to the first embodiment of the invention.

The above advantages are explained with reference to FIG. 3. FIG. 3 is a view showing energy bands of the semiconductor device according to the embodiment. The drawing represents a band structure obtained when voltage is applied to the gate electrode.

In FIG. 3, VB (Si), VB (SiGe) which are valence bands of Si and SiGe as well as CB (Si) which is a conduction band of Si are shown.

In the PMOS of the embodiment, the source/drain regions are made of silicon (Si) and the channel forming region CH is made of SiGe. Energy levels in the valence bands have a shape in which VB (Si) and VB (SiGe) are connected smoothly.

A dashed line "a" in FIG. 3 represents an energy level of the valence band of the SiGe channel transistor in related art disclosed in Patent Document 3 and so on. When comparing with the transistor made of only Si, a band gap is decreased and a potential becomes steep at a position indicated by X, therefore, speed of carrier injection is increased there.

On the other hand, in the transistor according to the embodiment, the gate electrode is formed with the second width wider than the first width of the SiGe layer at the region protruding from the forming region of the SiGe layer. Additionally, the transistor is formed so that the depletion layer extending from the junction surface between the extension region included in the source/drain region and the semiconductor substrate does not reach the SiGe layer. Accordingly, the energy level of the valence band of the transistor according to the embodiment is shown by a solid line "b" in FIG. 3.

Particularly, the energy level shown as "X" in related art is modified to the level shown by "Y".

According to the above, the semiconductor device according to the embodiment is capable of realizing improvement of carrier mobility and the increase of carrier speed in the channel while suppressing junction leakage due to the narrow band gap in the MOS field effect transistor. As a result, drive current of the transistor can be improved.

[Manufacturing Method of the Semiconductor Device]

Next, a manufacturing method of the semiconductor device according to the embodiment will be explained with reference to the drawings.

Figure 4A:
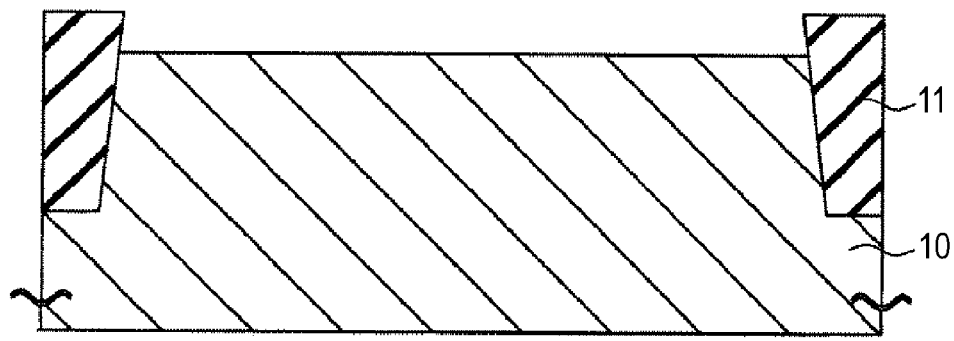
FIGS. 4A and 4B are cross-sectional views showing processes of a manufacturing method of the semiconductor device according to the first embodiment of the invention.

First, as shown in FIG. 4A, the element isolation insulating film 11 is pattern-formed in the semiconductor substrate 10 made of Si by using the STI method so as to isolate the active region with a film thickness of approximately 100 to 200 nm.

For example, silicon oxide is deposited to have a thickness of approximately 10 nm and silicon oxide is deposited to have a thickness of approximately 20 nm on the semiconductor substrate 10 and patterned into a pattern of the element isolation insulating film, then, a groove for element isolation is formed in the semiconductor device 10.

Next, the surface of the groove for element isolation is oxidized, for example, by heat treatment at 800° C. for approximately 20 minutes, and the groove for element isolation is embedded by CVD (Chemical Vapor Deposition) and the like to deposit silicon oxide over the whole surface. The silicon oxide film may be formed by a silicon oxide film using HDP (High Density Plasma) or a silicon oxide film with HARP (High Aspect Ratio Planarization) using $O_3$-TEOS (tetraethylorthosilicate).

Next, planarization by CMP (Chemical Mechanical Polishing) is performed and a silicon nitride film is removed by using hot phosphoric acid.

In the manner as described above, the element isolation insulating film 11 is formed.

Next, ion implantation for the well and the channel is performed.

In the drawing, a PMOS region is shown and, for example, P (phosphorus) is implanted at 500 keV with a dose amount of $3.0\times10^{13}/cm^2$ as the well and P (phosphorus) is implanted at 50 keV with a dose amount of $6.0\times10^{12}/cm^2$ as the channel. When an NMOS is formed at a not-shown region, for example, B (boron) is implanted at 230 keV with a dose amount of $2.0\times10^{13}/cm^2$ as the well and B (boron) is implanted at 20 keV with a dose amount of $1.0\times10^{13}/cm^2$ as the channel.

Figure 4B:
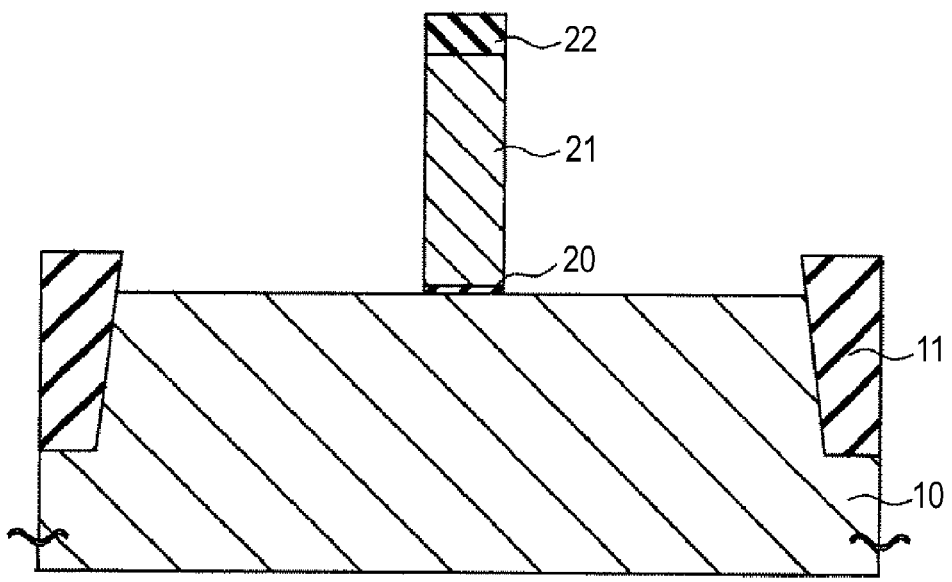

Next, the silicon oxide film is removed by using hydrofluoric acid, then, the silicon oxide film having a thickness approximately 3 to 5 nm is formed by thermal oxidation and so on to form a dummy gate insulating film 20 as shown in FIG. 4B. Next, polysilicon is deposited by a CVD method and the like, a hard mask 22 is formed to a pattern of the gate electrode and a dummy gate electrode 21 is formed by etching polysilicon.

Figure 5A:
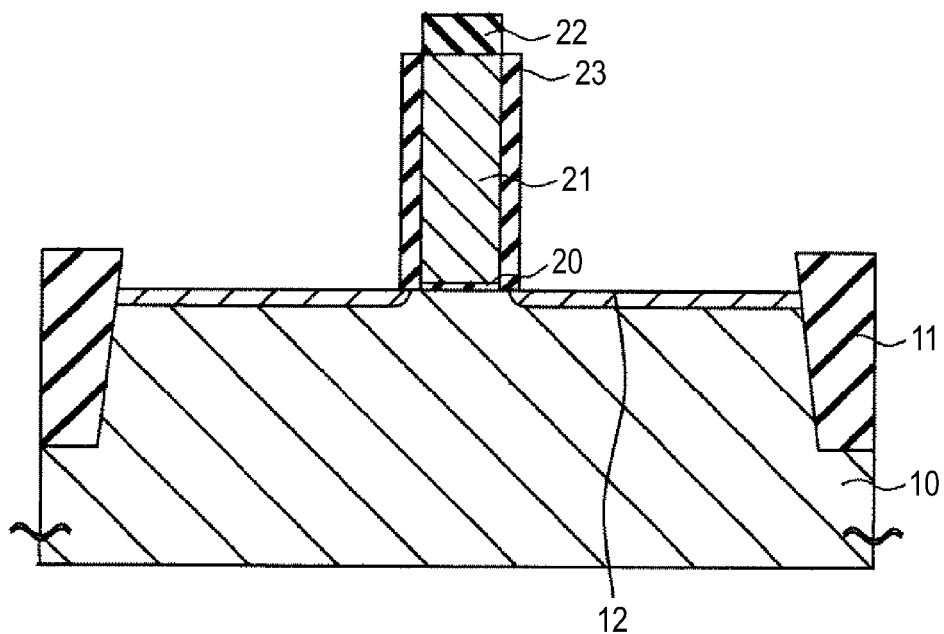
FIGS. 5A and 5B are cross-sectional views showing processes of the manufacturing method of the semiconductor device according to the first embodiment of the invention.

Next, as shown in FIG. 5A, silicon oxide is deposited to have a thickness of 4 to 8 nm on the whole surface by, for example, the CVD method and etched back over the whole surface to form offset spacers 23 at both sides of the dummy gate electrode 21.

Next, impurities are ion-implanted at the active region by using, for example, the offset spacers 23 and the hard mask 22 (or the dummy gate electrode 21) as masks to thereby form a pocket layer (Halo; not shown) and the extension regions 12 are formed in the semiconductor substrate 10.

In the drawing, the PMOS region is shown and for example, As (arsenic) is implanted at 50 keV with a dose amount of $2.0\times10^{13}/cm^2$ as the pocket layer and $BF_2$ (boron fluoride) is implanted at 1.5 keV with a dose amount of $6.0\times10^{14}/cm^2$ as the extension region. When the NMOS is formed at a not-shown region, for example, $BF_2$ (boron fluoride) is implanted at 40 keV with a dose amount of $2.0\times10^{13}/cm^2$ as the pocket layer and As (arsenic) is implanted at 1.5 keV with a dose amount of $6.0\times10^{14}/cm^2$ as the extension region.

Figure 5B:
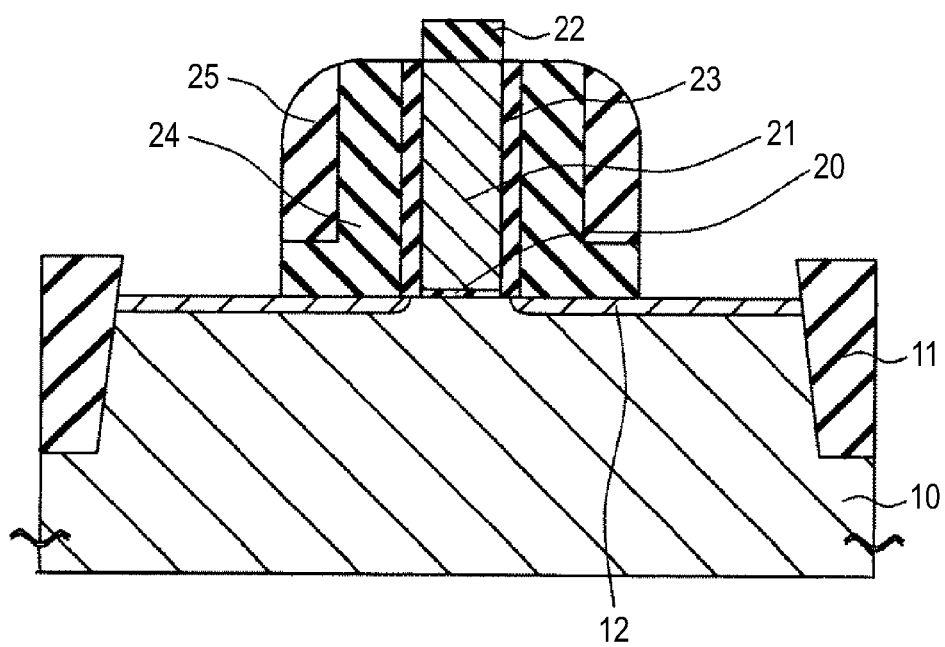

Next, as shown in FIG. 5B, silicon nitride is deposited, for example, to have a thickness of 20 nm on the whole surface by the CVD method, and silicon oxide is further deposited to have a thickness of 35 nm, then, etch back is performed over the whole surface. As a result of the process, the sidewall spacers 24 made of silicon nitride and sidewall spacers 25 made of silicon oxide are formed at both sides of the offset spacers 23. The sidewall spacers may be three-layer stacked insulating film in which the silicon oxide film, silicon nitride film and the silicon oxide film are stacked in order.

Figure 6A:
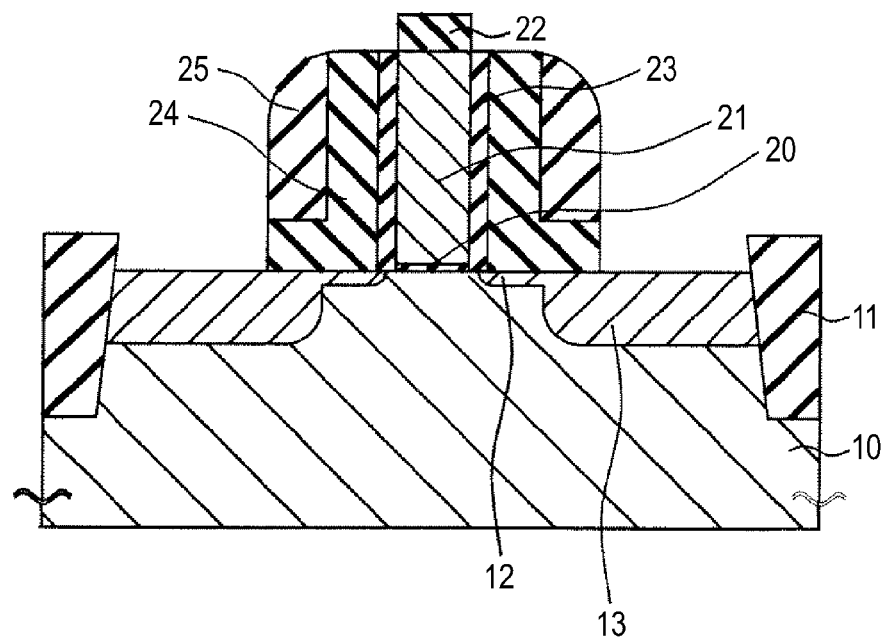
FIGS. 6A and 6B are cross-sectional views showing processes of the manufacturing method of the semiconductor device according to the first embodiment of the invention.

Next, as shown in FIG. 6A, impurities are ion-implanted at the active region by using, for example, the sidewall spacers (24, 25), the offset spacers 23 and the hard mask layer 22 (or the dummy gate electrode 21) as masks. For example, B (boron) is implanted at 4.0 keV with a dose amount of $4.0\times10^{15}/cm^2$. When the NMOS is formed at a not-shown region, for example, P (phosphorus) is implanted at 20 keV with a dose amount of $4.0\times10^{13}/cm^2$.

As the result of the above, the source/drain regions 13 are formed so as to be connected to the extension regions 12 in the semiconductor substrate 10.

After that, heat treatment of spike RTA processing (1030 to 1070° C.) is performed for activating impurities.

Figure 6B:
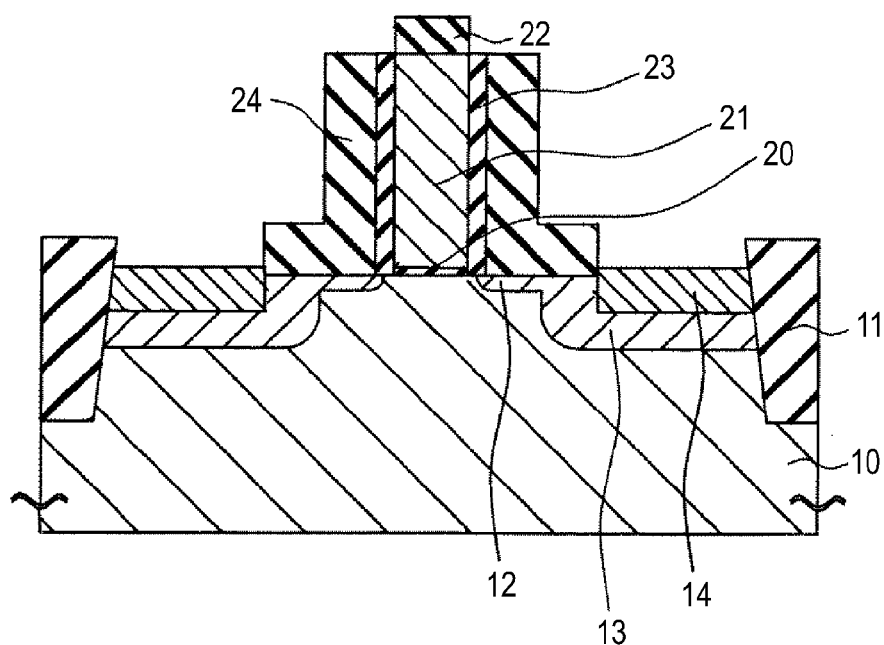

Next, as shown in FIG. 6B, for example, a refractory metal such as nickel, cobalt or platinum is deposited to have a film thickness of 2 to 8 nm on the whole surface by sputtering through pre-processing of diluted hydrofluoric acid (DHF). Next, regions where the refractory metal touches the silicon on surfaces of the source/drain regions are made silicide to form refractory metal silicide layers 14. After that, unreacted refractory metal is removed.

Here, the sidewall spacers 25 made of silicon oxide is removed in the DHF processing. A case in which only the sidewall spacers 24 made of silicon nitride are remained will be explained below.

Figure 7A:
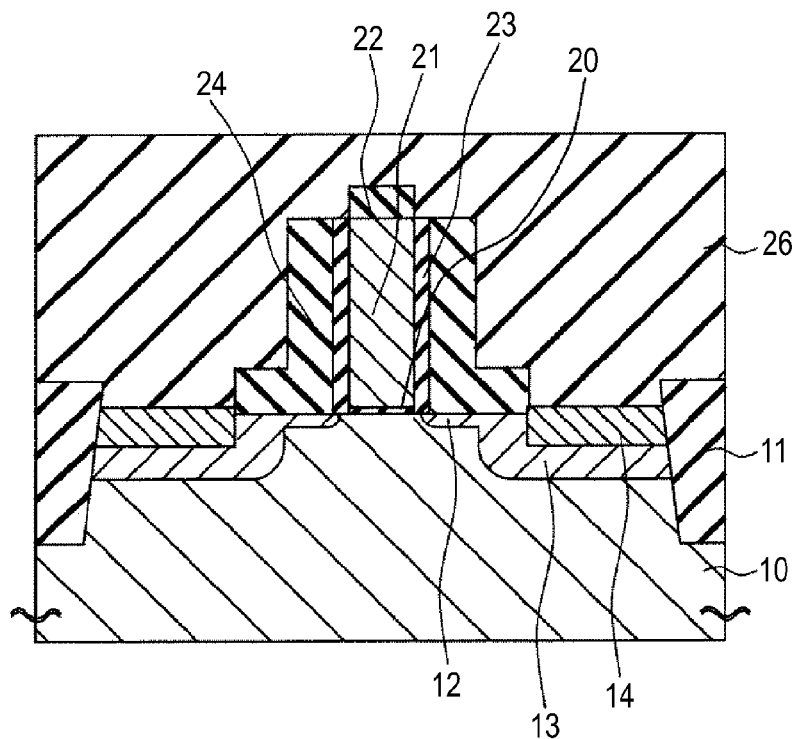
FIGS. 7A and 7B are cross-sectional views showing processes of a manufacturing method of the semiconductor device according to a second embodiment of the invention.

Next, as shown in FIG. 7A, for example, silicon oxide is deposited to have a thickness of 150 to 200 nm by the CVD method and the like on the whole surface so as to cover the hard mask layer 22 (or the dummy gate electrode 21), thereby forming the first interlayer insulating film 26.

Figure 7B:
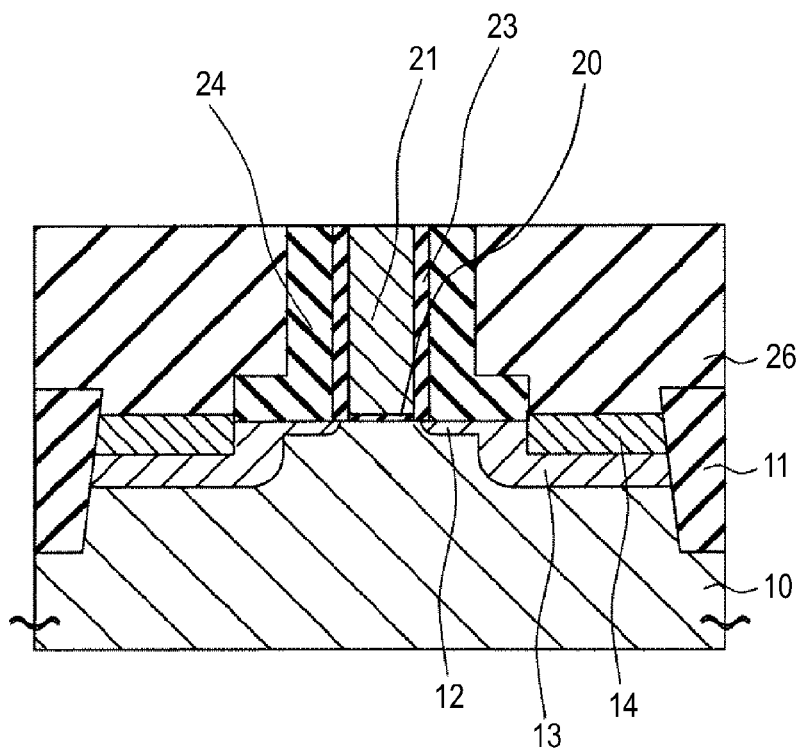

Next, as shown in FIG. 7B, for example, polishing is performed from the upper surface by using the CMP method until a surface of the dummy gate electrode 21 is exposed.

Figure 8A:
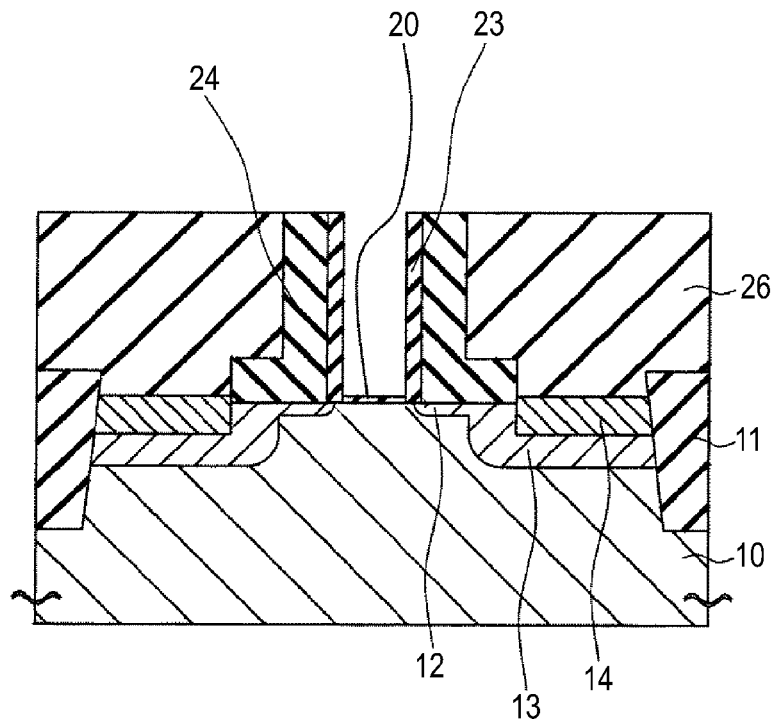
FIGS. 8A and 8B are cross-sectional views showing processes of the manufacturing method of the semiconductor device according to the second embodiment of the invention.

Next, as shown in FIG. 8A, for example, the dummy gate electrode 21 is removed by dry etching processing.

The above etching will satisfy etching condition which has a sufficient selection rate with respect to the dummy gate insulating film of silicon oxide. At this time, the film thickness of the dummy gate insulating film 20 is the film thickness capable of withstanding dry etching, therefore, the semiconductor substrate 10 is not damaged.

Figure 8B:
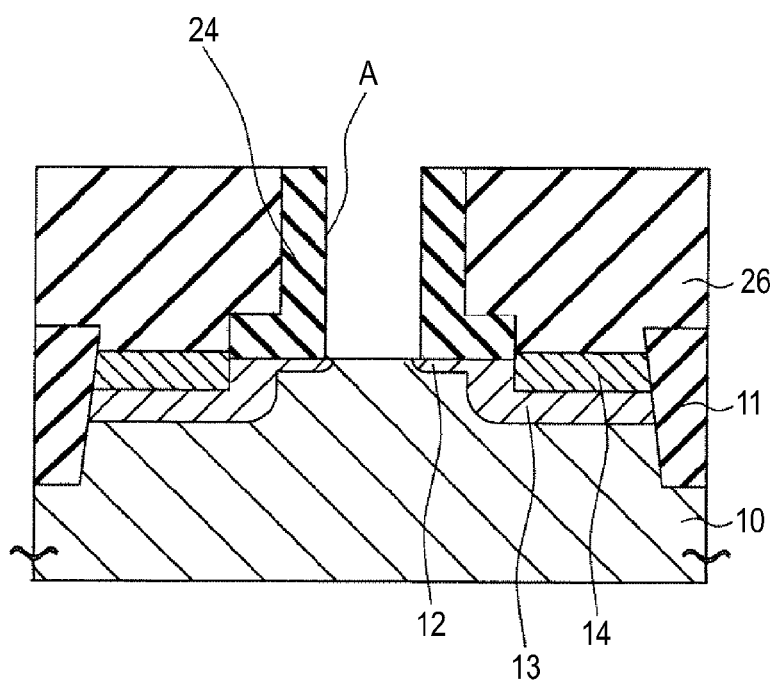

Next, as shown in FIG. 8B, for example, the dummy gate insulating film 20 and the offset spacers 23 are removed by using hydrofluoric acid.

In the manner as described above, the groove for the gate electrode "A" is formed at the region between the pair of sidewall spacers 24.

Figure 9A:
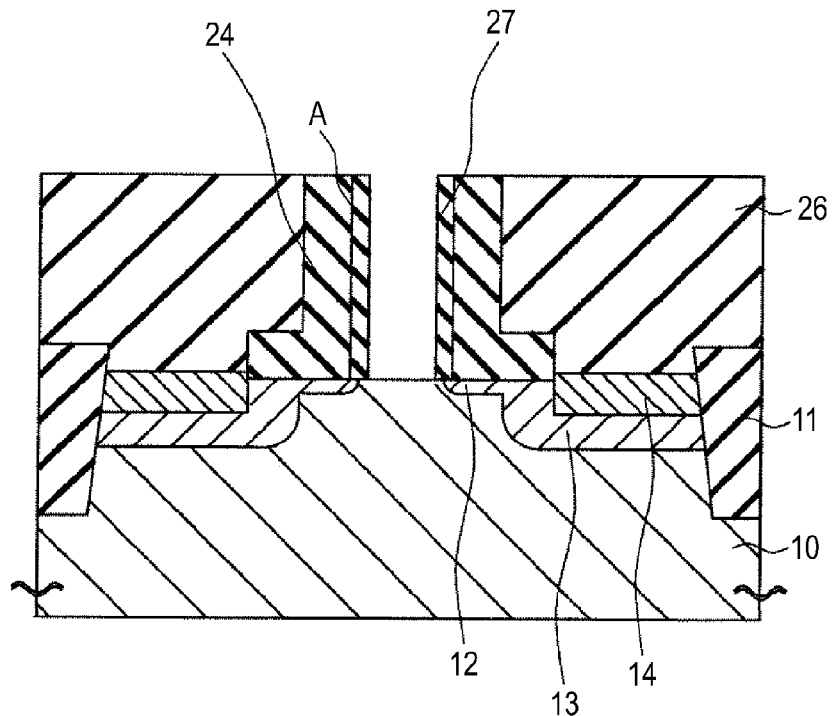
FIGS. 9A and 9B are cross-sectional views showing processes of the manufacturing method of the semiconductor device according to the second embodiment of the invention.

Next, as shown in FIG. 9A, for example, silicon nitride (SiN), silicon nitride including boron (SiBN) or silicon nitride including carbon (SiCN) is deposited to have a thickness of 2 to 6 nm on the whole surface by the CVD method and etched back on the whole surface.

As the result of the process, offset spacers 27 for etching only Si at the channel region in which the impurity at the extension regions is not diffused are formed at wall surfaces inside the groove for the gate electrode "A".

There is a pre-processing process by hydrofluoric acid for epitaxial growth of SiGe after the above process, and the silicon nitride film, the silicon nitride film including boron or the silicon nitride film including carbon having tolerance for hydrofluoric acid can be used. It is necessary to control the film thickness of the offset spacers 27 to be approximately 2 to 6 nm so that only silicon at the necessary region is etched.

Figure 9B:
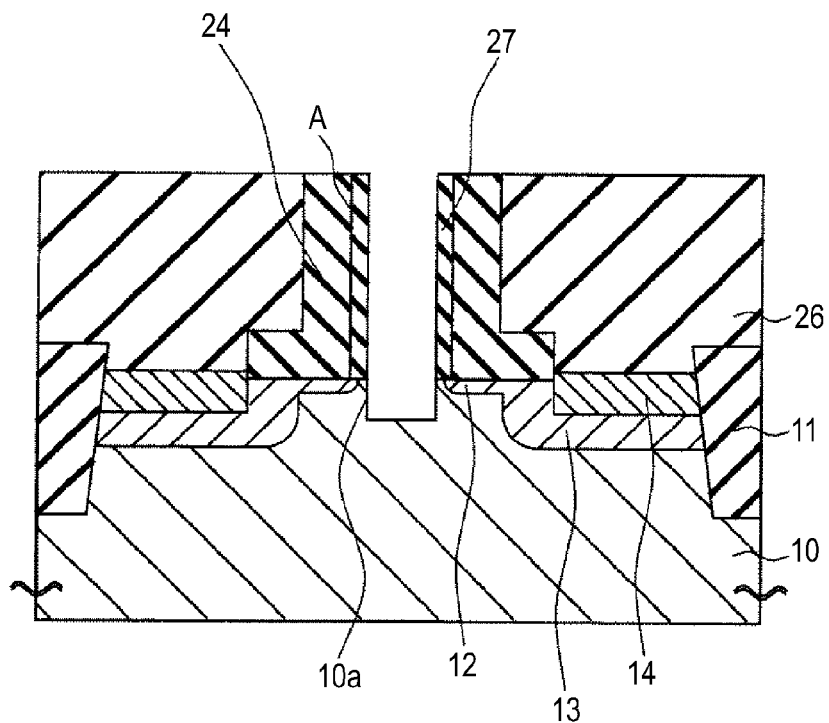

Next, as shown in FIG. 9B, only Si at the channel region in which the impurity of the extension regions is not diffused is etched by using, for example, the offset spacers 27 as masks to thereby form the concave portion for embedding the SiGe layer 10a. The concave portion for embedding the SiGe layer 10a has the first width.

The depth of the concave portion for embedding the SiGe layer 10a is approximately 5 to 20 nm. The concave portion for embedding the SiGe layer 10a may be formed so that at least an inversion layer region to which carriers are moved will be the SiGe layer.

Figure 10A:
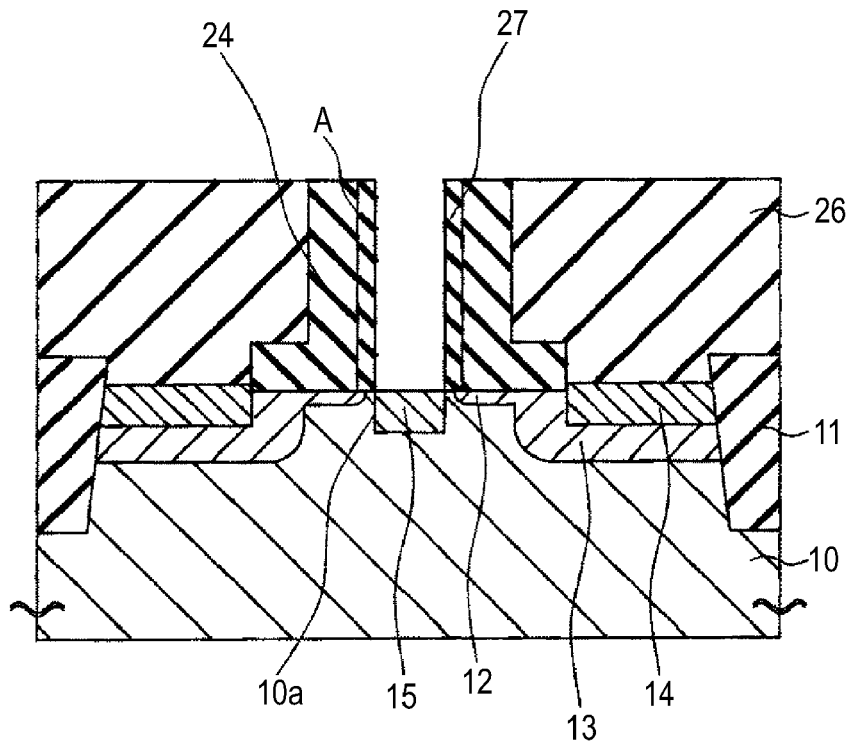
FIGS. 10A and 10B are cross-sectional views showing processes of the manufacturing method of the semiconductor device according to the second embodiment of the invention.

Next, as shown in FIG. 10A, for example, after performing pre-processing by hydrofluoric acid, epitaxial growth is performed to form the SiGe layer 15 by being embedded in the concave portion for embedding the SiGe layer 10a. The SiGe layer 15 has the first width in the channel direction. The SiGe layer 15 can be represented as $Si_{1-x}Ge_x$ (x=0 to 1) in composition, in which Ge concentration can be changed freely.

Figure 10B:
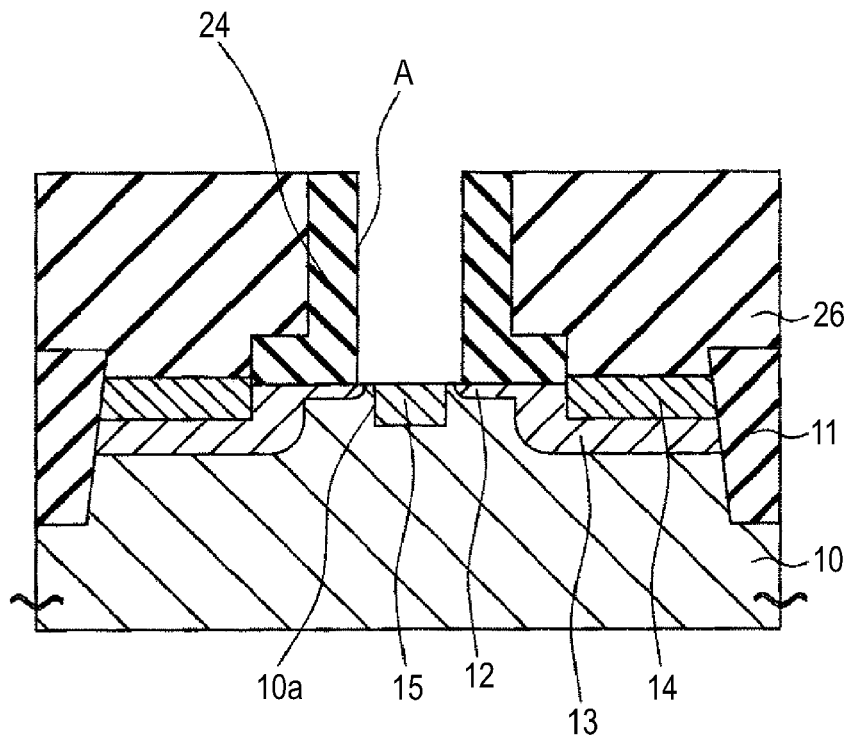

Next, as shown in FIG. 10B, for example, the offset spacers 27 made of the silicon nitride film, the SiBN film or silicon nitride including carbon (SiCN) are removed by using hot phosphoric acid. At this time, it is desirable to remove only the formed offset spacers 27. For example, when the film thickness of the offset spacers 27 is 4 nm, the processing using hot phosphoric acid of removing the silicon nitride or SiBN for just 4 nm is performed.

As a result of the above processing, the surface of the semiconductor substrate 10 in the groove "A" for the gate electrode is exposed again.

Figure 11A:
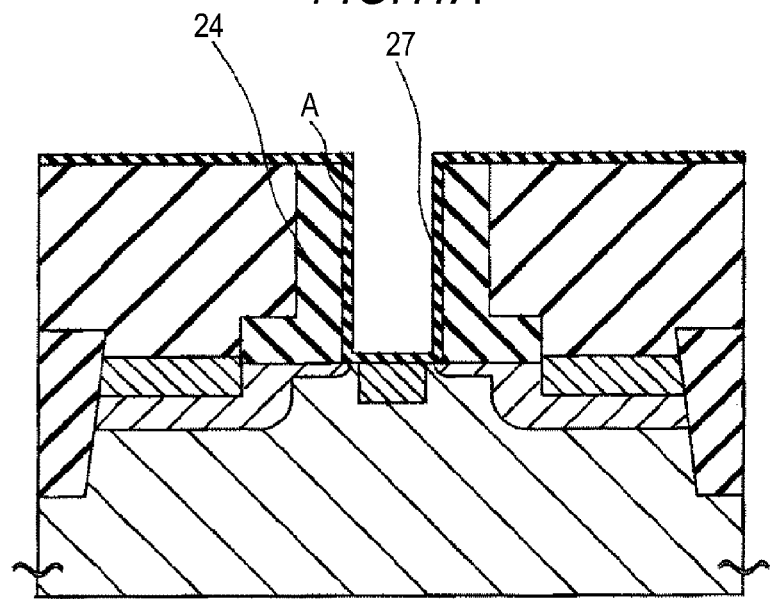
FIGS. 11A and 11B are cross-sectional views showing processes of the manufacturing method of the semiconductor device according to the second embodiment of the invention.

Next, as shown in FIG. 11A, for example, the gate insulating film 28 made of the High-k film such as hafnium oxide or aluminum oxide is formed on the whole surface so as to cover the surface of the SiGe layer in the bottom of the groove for gate electrode "A" in which the offset spacers 27 are removed.

Figure 11B:
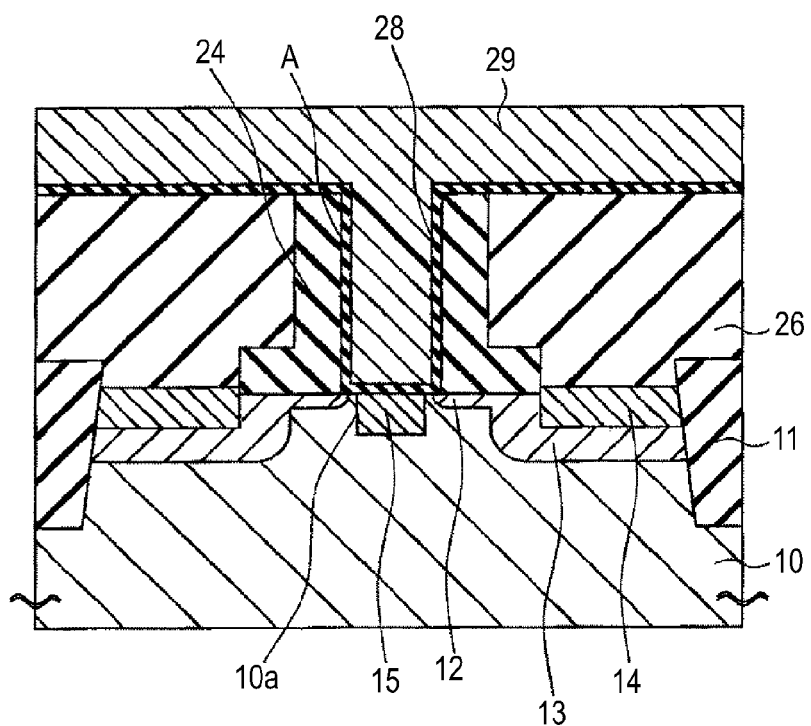

Next, as shown in FIG. 11B, for example, the gate electrode 29 is formed with the second width wider than the first width at the region protruding from the forming region of the SiGe layer on the gate insulating film 28 so as to fill in the groove for the gate electrode "A" by using a sputtering method or the CVD method.

The gate electrode 29 is made of, for example, titanium nitride, hafnium silicide (HfSi) and the like.

Figure 12A:
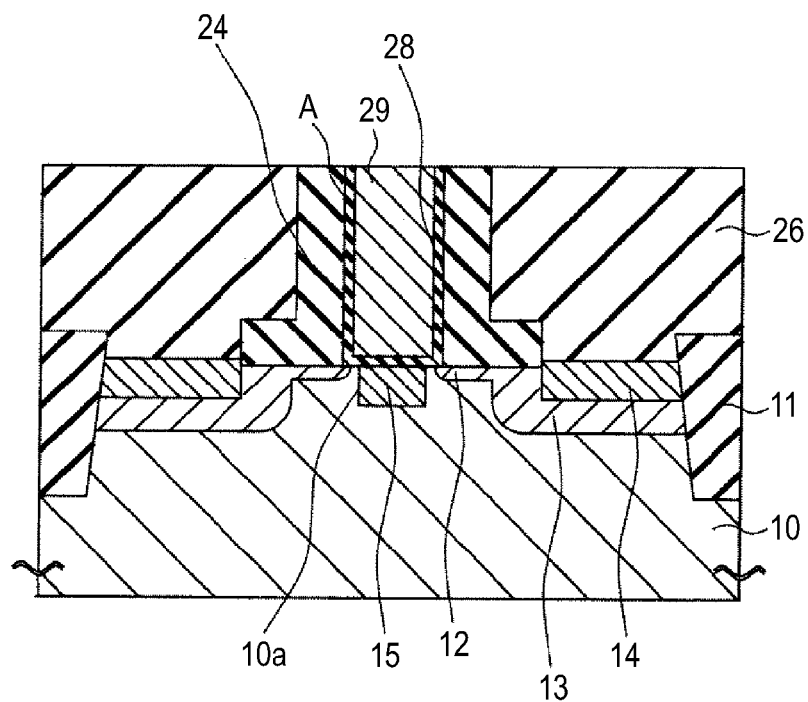
FIGS. 12A and 12B are cross-sectional views showing processes of the manufacturing method of the semiconductor device according to the second embodiment of the invention.

Next, as shown in FIG. 12A, for example, the conductive material to be the gate electrode deposited outside the groove for the gate electrode "A" is removed by the CMP process to form the gate electrode 29 embedded in the groove for the gate electrode "A".

Figure 12B:
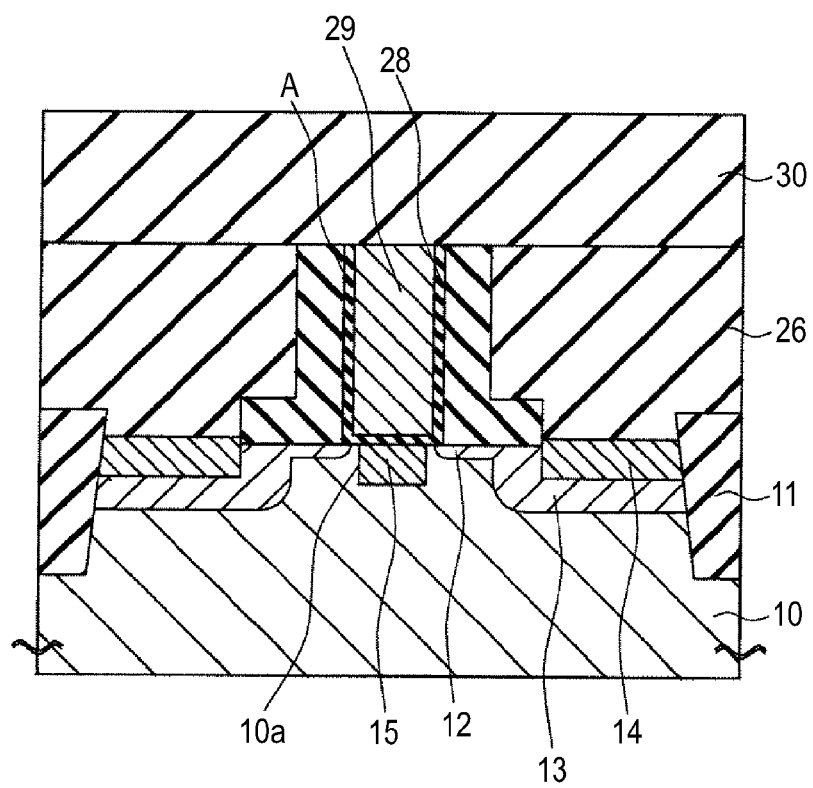

Next, as shown in FIG. 12B, for example, the second interlayer insulating film 30 is formed by depositing the silicon oxide to have a film thickness of 50 nm to 100 nm by the CVD method on the whole surface.

As subsequent processes, for example, openings reaching the refractory metal silicide layers 14 of the source/drain regions 13 and the gate electrode 29 are formed so as to pierce through the second interlayer insulating film 30 and the first interlayer insulating film 26.

In the obtained openings, Ti (30 nm)/Tin (10 nm) are deposited as barrier metal, and plugs 31 made of tungsten and the like are embedded therein. Moreover, the conductive material is pattern-formed so as to connect to the plugs 31 to form the upper wiring 32.

As described above, the semiconductor device having the same structure as the structure of the semiconductor device shown in FIG. 1 and FIGS. 2A, 2B can be manufactured.

In the present embodiment, as shown in FIG. 2B, the extension region having the overlap region in which the extension region 12 enters beneath the gate electrode 29 can be formed.

In the transistor according to the embodiment, the gate electrode is formed with the second width wider than the first width of the SiGe layer at the region protruding from the forming region of the SiGe layer. Additionally, the transistor is formed so that the depletion layer extending from the junction surface between the extension region included in the source/drain region and the semiconductor substrate does not reach the SiGe layer. According to the structure, improvement of carrier mobility as well as increase of carrier speed in the channel can be realized while suppressing junction leakage due to the narrow band gap. As a result, it is possible to improve drive current of the transistor.

According to the manufacturing method of the semiconductor device of the embodiment, the MOS field effect transistor capable of realizing improvement of carrier mobility as well as increase of carrier speed in the channel while suppressing junction leakage can be formed.

Second Embodiment

[Cross-Sectional Structure of a Semiconductor Device]

Figure 13:
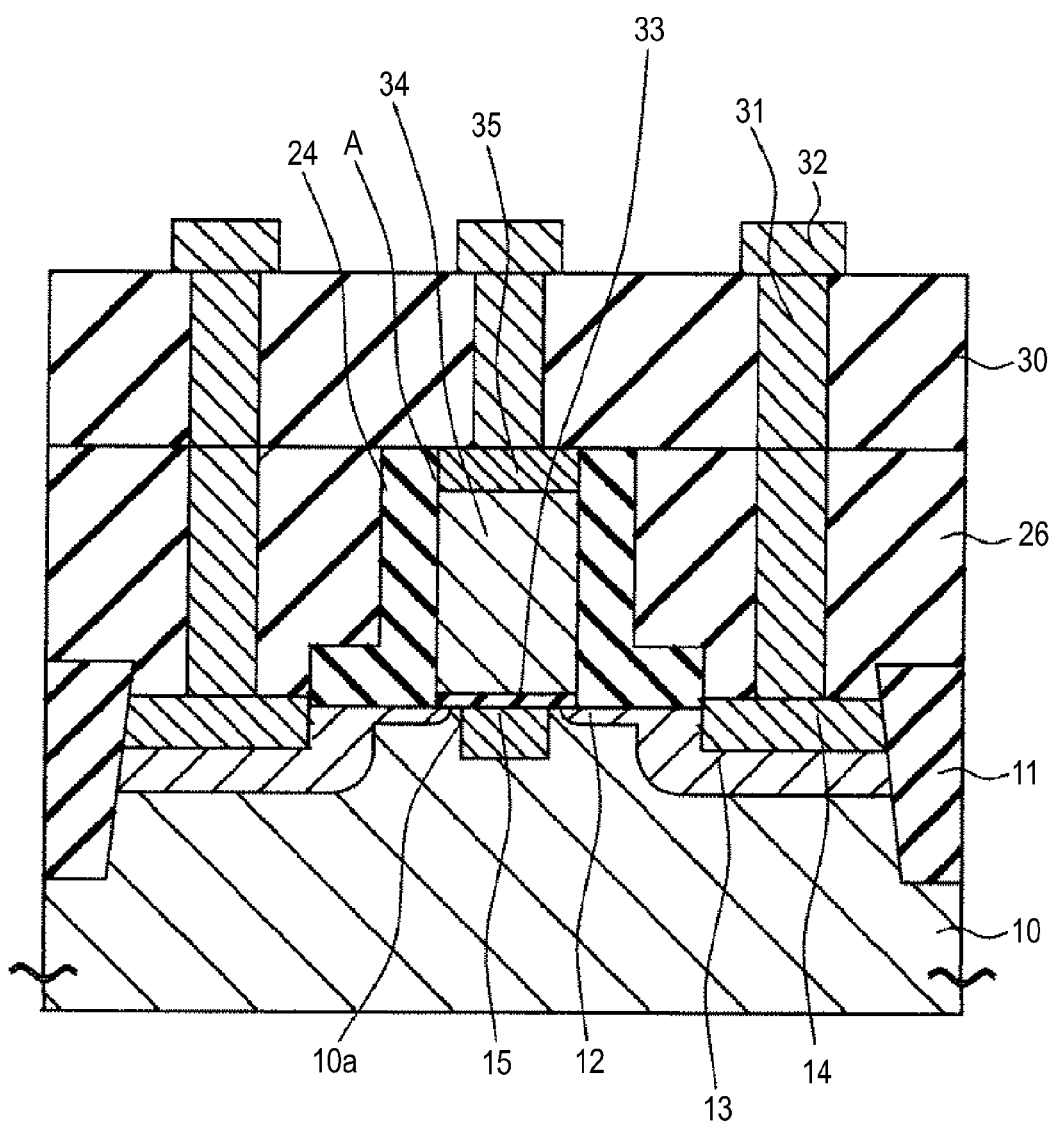
FIG. 13 is a cross-sectional view of a semiconductor device according to the second embodiment of the invention.

FIG. 13 is a cross-sectional view of a semiconductor device according to the embodiment.

For example, a gate insulating film 33 made of silicon oxide and so on is formed on a bottom of the groove for the gate electrode "A". A gate electrode 34 made of polysilicon is formed in the groove for the gate electrode "A" in the upper layer of the gate insulating film 33. A refractory metal silicide layer 35 made of NiSi and the like is formed at an upper surface of the gate electrode 34.

The device has the same structure as the first embodiment except the above.

In the transistor according to the embodiment, the gate electrode is formed with the second width wider than the first width of the SiGe layer at the region protruding from the forming region of the SiGe layer. Additionally, the transistor is formed so that the depletion layer extending from the junction surface between the extension region included in the source/drain region and the semiconductor substrate does not reach the SiGe layer.

According to the above structure, the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

[Manufacturing Method of the Semiconductor Device]

Next, a manufacturing method of the semiconductor device according to the embodiment will be explained with reference to the drawings.

Figure 14A:
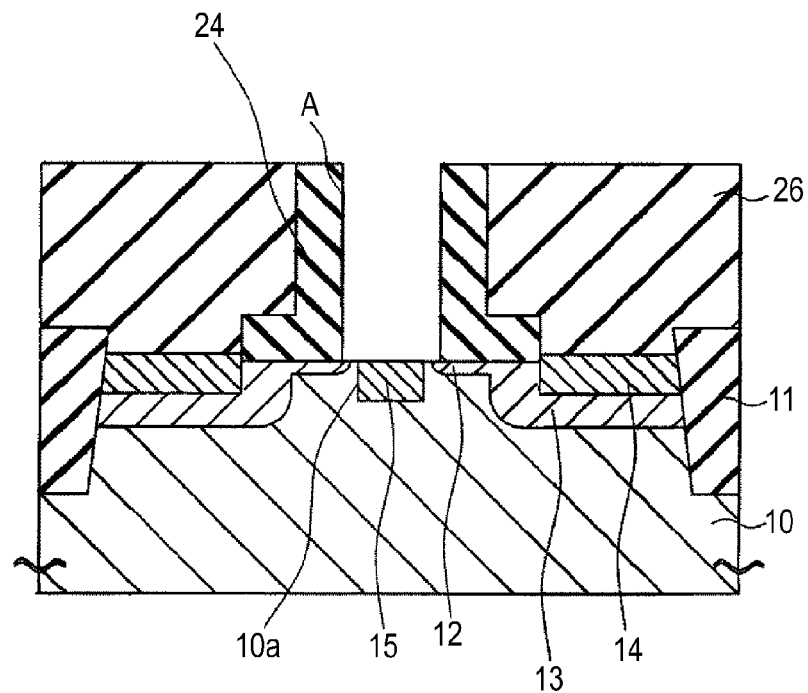
FIGS. 14A and 14B are cross-sectional views showing processes of a manufacturing method of the semiconductor device according to the second embodiment of the invention.

First, the processes to FIG. 10B of the first embodiment are performed in the same manner until reaching the structure shown in FIG. 14A.

Figure 14B:
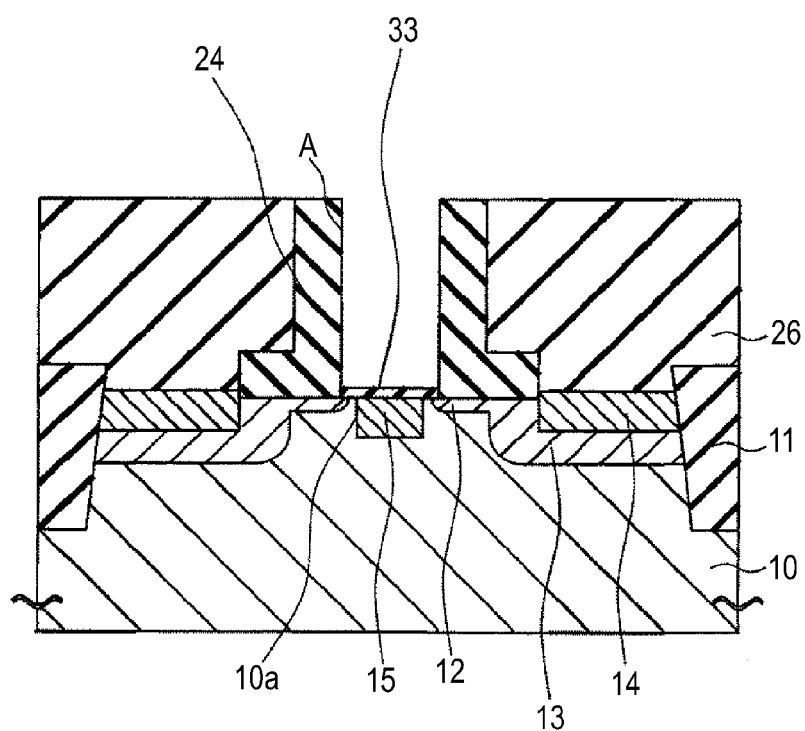

Next, for example, as shown in FIG. 14B, for example, the gate insulating film 33 made of silicon oxide is formed so as to cover the whole surface of the SiGe layer at the bottom of the groove for the gate electrode "A" from which the offset spacers have been removed by the CVD method and the like.

Figure 15A:
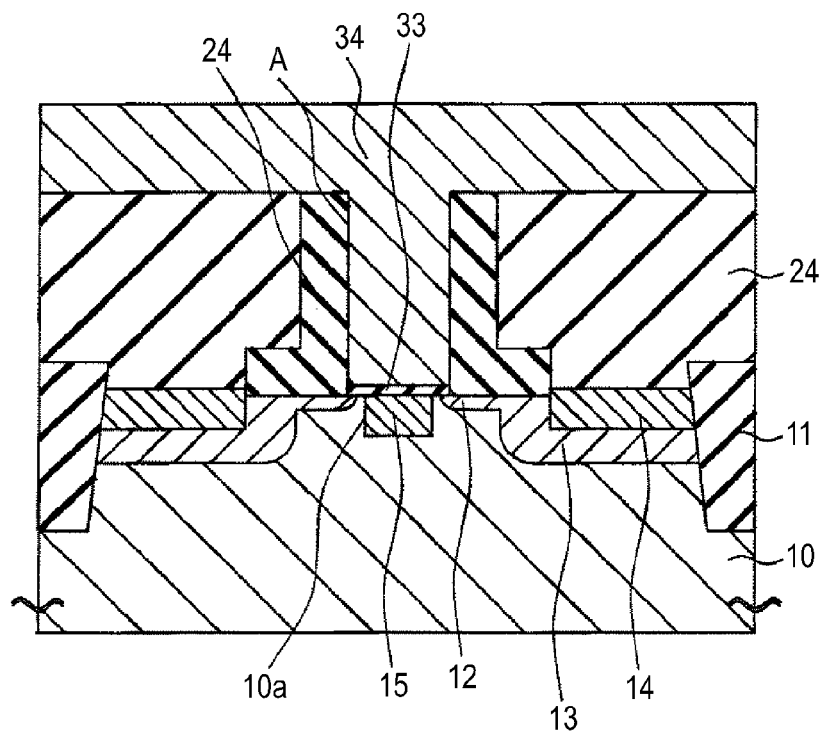
FIGS. 15A and 15B are cross-sectional views showing processes of the manufacturing method of the semiconductor device according to the second embodiment of the invention.

Next, as shown in FIG. 15A, polysilicon is deposited to fill in the groove for the gate electrode "A" by the CVD method to form the gate electrode 34 with the second width wider than the first width at the region protruding from the forming region of the SiGe layer on the gate insulating film 33.

Figure 15B:
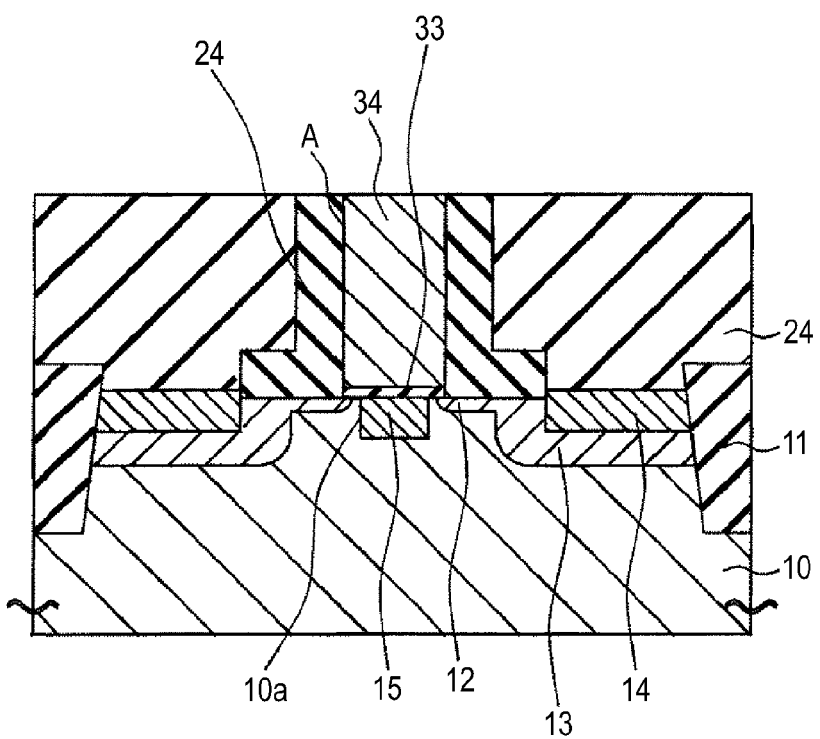

Next, as shown in FIG. 15B, for example, the polysilicon deposited outside the groove for the gate electrode "A" is removed by the CMP processing to form the gate electrode 34 embedded in the groove for the gate electrode "A".

Figure 16A:
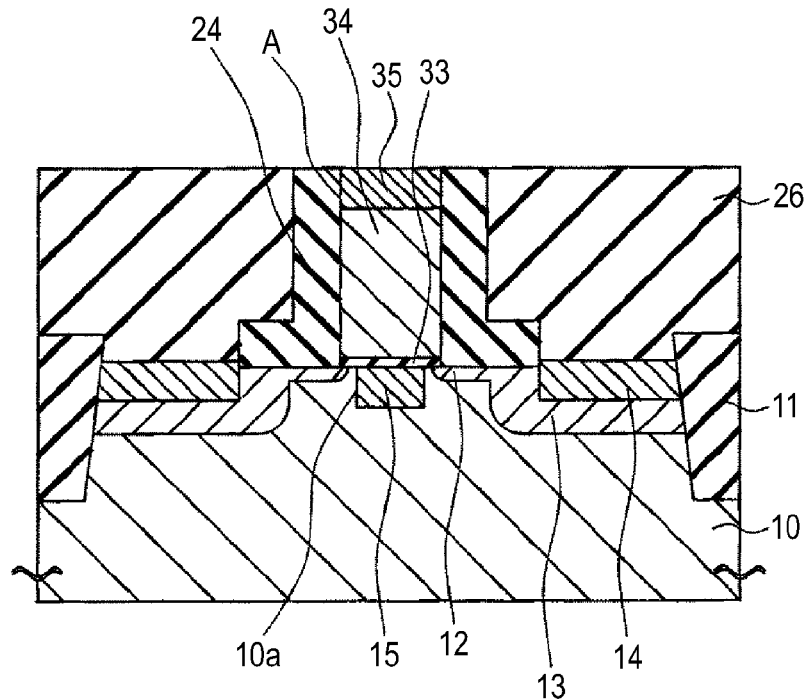
FIGS. 16A and 16B are cross-sectional views showing processes of the manufacturing method of the semiconductor device according to the second embodiment of the invention.

Next, as shown in FIG. 16A, for example, a refractory metal such as nickel, cobalt or platinum is deposited to have a film thickness of 2 to 8 nm on the whole surface by sputtering through pre-processing of diluted hydrofluoric acid (DHF). Next, a region where the refractory metal touches the silicon on the surface of the gate electrode is made silicide to form the refractory metal silicide layer 35. After that, unreacted refractory metal is removed.

Figure 16B:
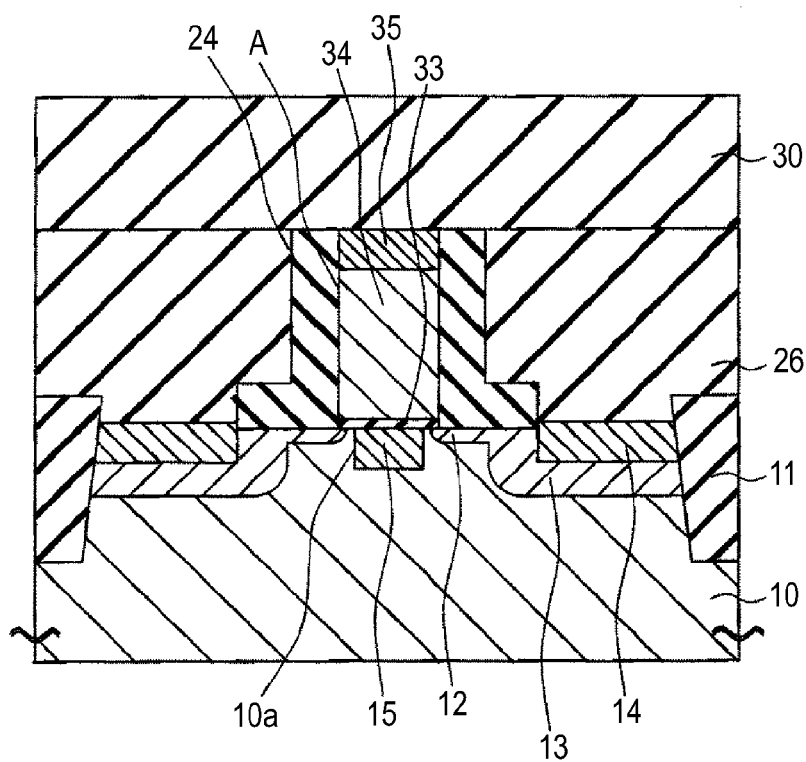

Next, as shown in FIG. 16B, for example, silicon oxide is deposited on the whole surface to have a film thickness of 50 to 100 nm by the CVD method to form the second interlayer insulating film 30.

As the processes after that, for example, openings reaching the refractory metal silicide layers 14 of the source/drain regions 13 and the refractory metal silicide layer 35 of the gate electrode 34 are formed so as to pierce through the second interlayer insulating film 30 and the first interlayer insulating film 26.

In the obtained openings, Ti (30 nm)/Tin (10 nm) are deposited as barrier metal, and plugs 31 made of tungsten and the like are embedded therein. Moreover, the conductive material is pattern-formed so as to connect to the plugs 31 to form the upper wiring 32.

As described above, the semiconductor device having the same structure as the structure of the semiconductor device shown in FIG. 13 can be manufactured.

Processes other than the above are substantially the same as the first embodiment.

According to the manufacturing method of the semiconductor device of the embodiment, the MOS field effect transistor capable of realizing improvement of carrier mobility as well as increase of carrier speed in the channel while suppressing junction leakage can be formed in the same manner as the first embodiment.

Third Embodiment

[Cross-Sectional Structure of a Semiconductor Device]

Figure 17A:
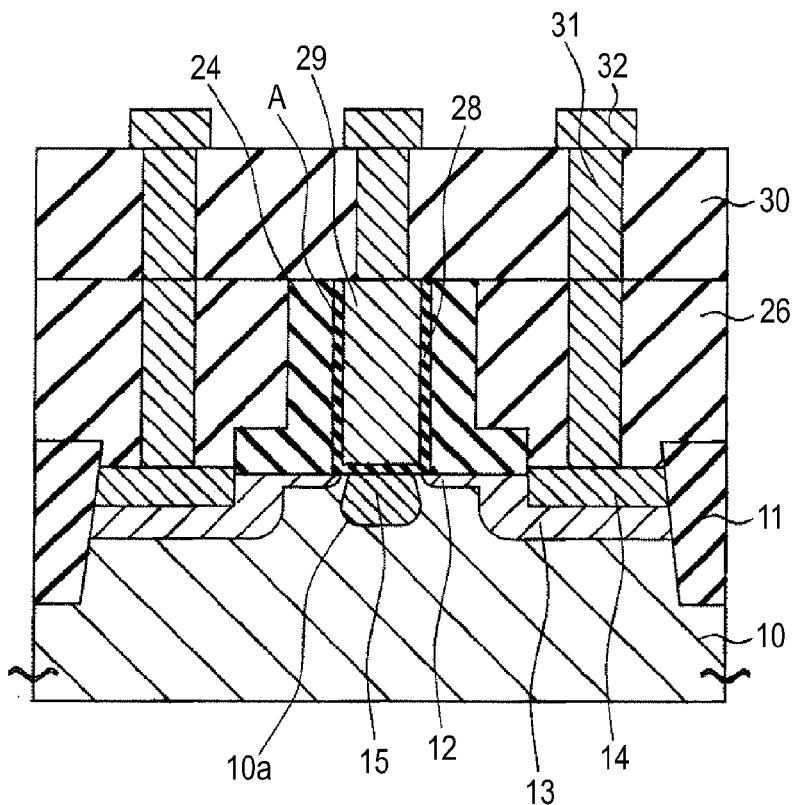
FIG. 17A is a cross-sectional view of a semiconductor device according to a third embodiment and FIG. 17B is an enlarged view of a part of FIG. 17A.
Figure 17B:
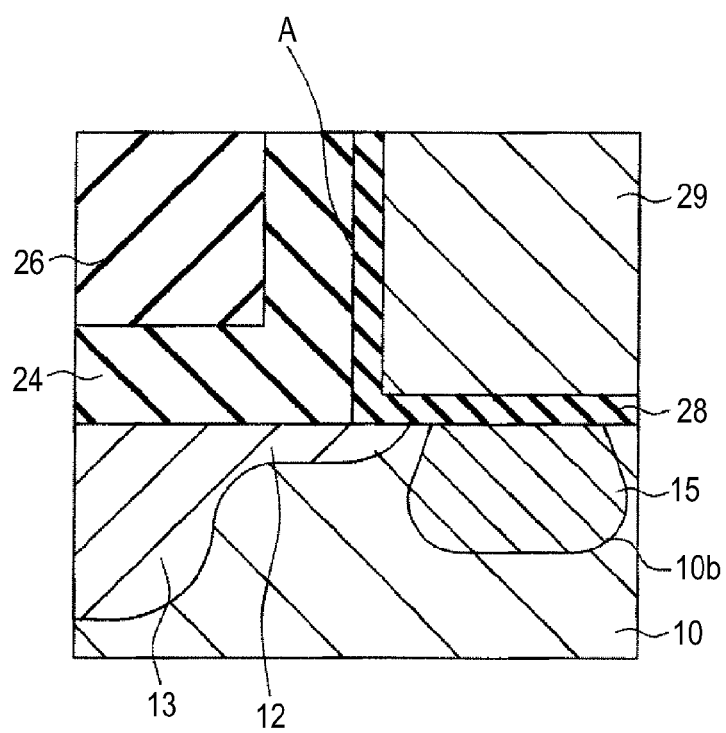

FIG. 17A is a cross-sectional view of a semiconductor device according to the embodiment, and FIG. 17B is an enlarged view of a part in the vicinity of the extension region, the gate electrode and the SiGe layer, which is the part of FIG. 17A.

For example, a concave portion for embedding the SiGe layer 10b has a region in which the width in the channel direction becomes wider as the depth from the surface of the semiconductor device 10 becomes deeper. Therefore, the SiGe layer 15 embedded in the concave portion for embedding the SiGe layer 10b has the region in which the width in the channel direction becomes wider as the depth from the surface of the semiconductor device 10 becomes deeper.

The device has the same structure as the first embodiment except the above.

In the transistor according to the embodiment, the gate electrode is formed with the second width wider than the first width of the SiGe layer at the region protruding from the forming region of the SiGe layer. The transistor is formed so that the depletion layer extending from the junction surface between the extension region included in the source/drain region and the semiconductor substrate does not reach the SiGe layer.

As described above, the semiconductor device according to the embodiment can realize the improvement of carrier mobility as well as increase of carrier speed while suppressing junction leakage due to the narrow band gap in the MOS field effect transistor. As a result, drive current of the transistor can be improved.

As one of reasons why mobility of hole carriers in $Si_{1-x}Ge_x$ (x=0 to 1) is high is that Ge having high carrier mobility is included. Additionally, it may be cited that compression stress is given to $Si_{1-x}Ge_x$ (x=0 to 1) in the channel region because Ge having a larger ion radius than Si is included. The effect contributes to the improvement of hole carrier mobility. Therefore, the higher the volume of the SiGe layer is, the higher the compression stress is. The structure of the $Si_{1-x}Ge_x$ (x=0 to 1) layer having the region in which the width of the channel direction becomes wider as the depth from the surface of the semiconductor device 10 becomes deeper can increase the above compression stress, which further increases the carrier mobility.

[Manufacturing Method of the Semiconductor Device]

Next, a manufacturing method of the semiconductor device according to the embodiment will be explained with reference to the drawings.

Figure 18A:
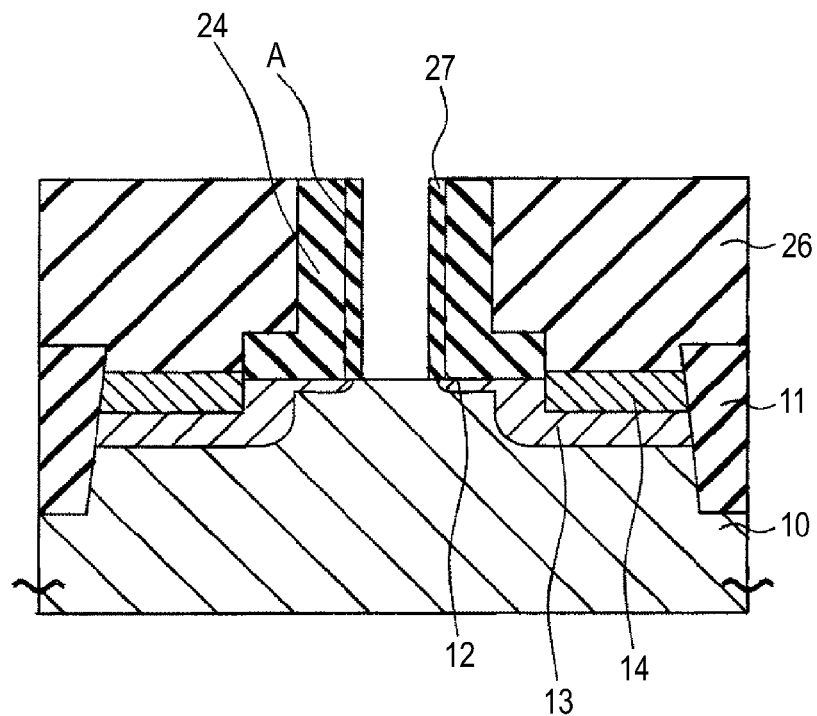
FIGS. 18A and 18B are cross-sectional views showing processes of a manufacturing method of the semiconductor device according to the third embodiment of the invention.

First, the processes to FIG. 9B of the first embodiment are performed in the same manner until reaching the structure shown in FIG. 18A.

Figure 18B:
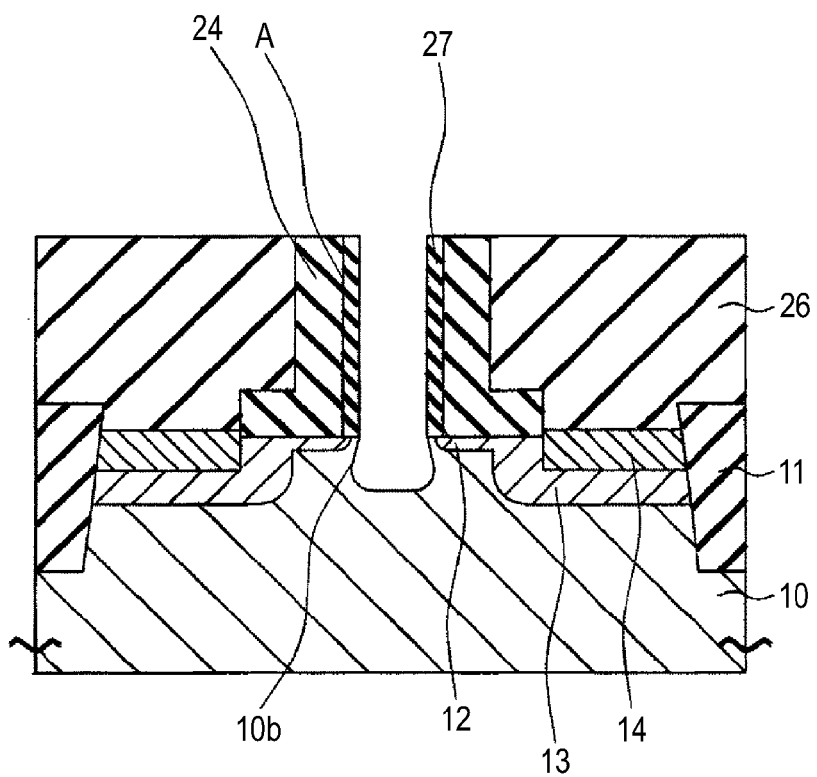

Next, as shown in FIG. 18B, for example, only Si in the channel region in which the impurity at the extension regions is not diffused is etched by using the offset spacers 27 as masks to thereby form the concave portion for embedding the SiGe layer 10b. The concave portion for embedding the SiGe layer 10b has the first width in the channel direction.

The depth of the concave portion for embedding the SiGe layer 10b is approximately 5 to 20 nm. The concave portion for embedding the SiGe layer 10b may be formed so that at least the inversion layer region to which carriers are moved will be the SiGe layer.

Here, in order to make the shape having the region in which the width of the channel direction becomes wider as the depth from the surface of the semiconductor device becomes deeper, for example, anisotropic etching conditions are used at the initial state and isotropic etching conditions are sequentially used.

Next, for example, after performing pre-processing by hydrofluoric acid, epitaxial growth is performed to form the SiGe layer 15 by being embedded in the concave portion for embedding the SiGe layer 10b.

In the present embodiment, in the process of forming the SiGe layer 15, the layer is formed so as to include the region in which the width of the SiGe layer 15 in the channel direction becomes wider as the depth from the surface of the semiconductor device 10 becomes deeper.

The SiGe layer 15 has the first width in the channel direction. The SiGe layer 15 can be represented as $Si_{1-x}Ge_x$ (x=0 to 1) in composition, in which Ge concentration can be changed freely.

As the upper surface of the region on which epitaxial growth is performed is narrow, it is desirable to use conditions of anisotropic epitaxial growth performed only from the lower surface for performing epitaxial growth on the etched region completely.

Processes other than the above are substantially the same as the first embodiment.

According to the manufacturing method of the semiconductor device of the embodiment, the MOS field effect transistor capable of realizing improvement of carrier mobility as well as increase of carrier speed in the channel while suppressing junction leakage can be formed in the same manner as the first embodiment.

Fourth Embodiment

[Cross-Sectional Structure of a Semiconductor Device]

Figure 19A:
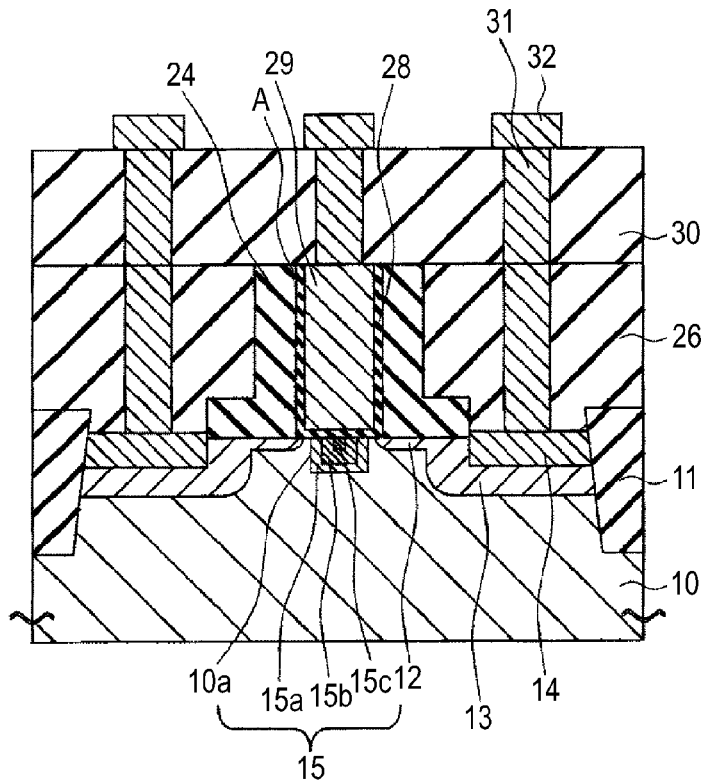
FIG. 19A is a cross-sectional view of a semiconductor device according to a fourth embodiment and FIG. 19B is an enlarged view of a part of FIG. 19A.
Figure 19B:
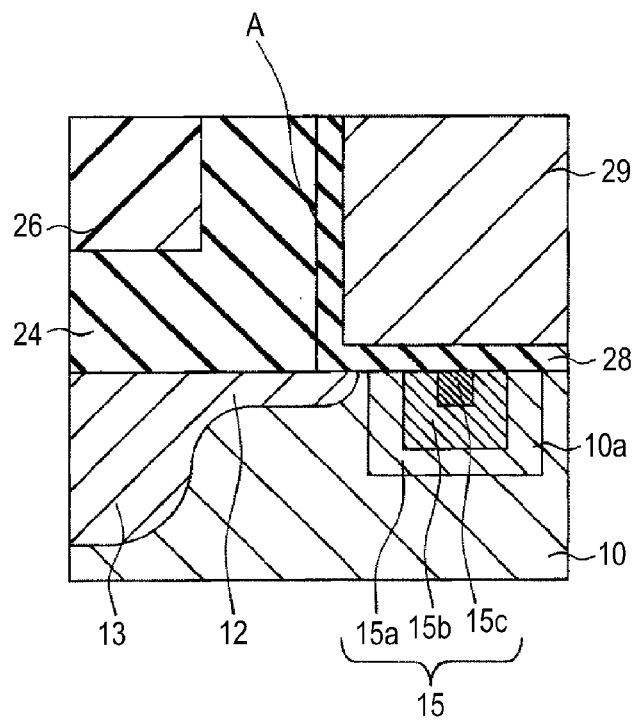

FIG. 19A is a cross-sectional view of a semiconductor device according to the embodiment and FIG. 19B is an enlarged view of a part in the vicinity of the extension region, the gate electrode and the SiGe layer, which is the part of FIG. 19A.

For example, in the SiGe layer 15, the concentration of Ge is increased from an end portion on the side of the source/drain regions 13 toward the central direction of the SiGe layer 15. For example, a low-concentration SiGe layer 15a, an intermediate-concentration SiGe layer 15b and a high-concentration SiGe layer 15c concerning the Ge concentration are sequentially formed.

The device has the same structure as the first embodiment except the above.

In the transistor according to the embodiment, the gate electrode is formed with the second width wider than the first width of the SiGe layer at the region protruding from the forming region of the SiGe layer. Additionally, the transistor is formed so that the depletion layer extending from the junction surface between the extension region included in the source/drain region and the semiconductor substrate does not reach the SiGe layer.

As described above, the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

Particularly, in the transistor according to the embodiment, the Ge concentration is increased toward the channel center. As the Ge concentration is gradually increased, the maximum Ge concentration can be increased without causing defects between the Si layer and the $Si_{x-1}Ge_x$ (x=0 to 1) layer. As a result, it is possible to make the potential change steeper, which further increases carrier speed.

[Manufacturing Method of the Semiconductor Device]

Next, a manufacturing method of the semiconductor device according to the embodiment will be explained with reference to the drawings.

First, the processes are performed in the same manner until reaching the structure shown in FIG. 9B of the first embodiment.

Next, for example, after performing pre-processing by hydrofluoric acid, epitaxial growth is performed to form the SiGe layer 15 by being embedded in the concave portion for embedding the SiGe layer 10a. Here, the low-concentration SiGe layer 15a, the intermediate-concentration SiGe layer 15b and the high-concentration SiGe layer 15c are sequentially formed. As the result of the process, the concentration of Ge is increased from the end portion on the side of the source/drain regions 13 toward the central direction of the SiGe layer 15.

Processes other than the above are substantially the same as the first embodiment.

According to the manufacturing method of the semiconductor device according to the embodiment, the MOS field effect transistor capable of realizing improvement of carrier mobility as well as increase of carrier speed in the channel while suppressing junction leakage can be formed in the same manner as the first embodiment.

Fifth Embodiment

[Cross-Sectional Structure of a Semiconductor Device]

Figure 20A:
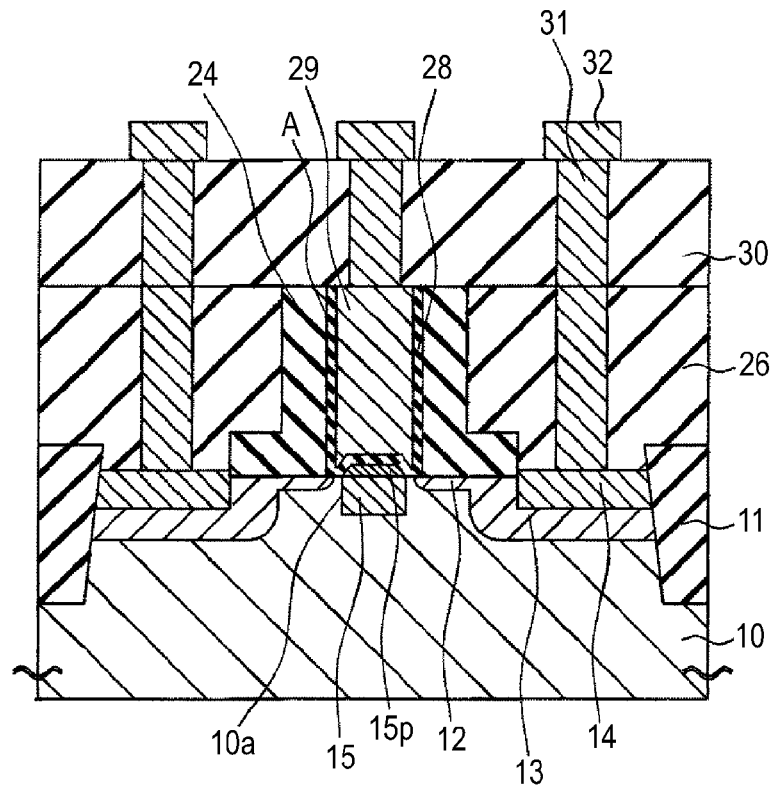
FIG. 20A is a cross-sectional view of a semiconductor device according to a fifth embodiment and FIG. 20B is an enlarged view of a part of FIG. 20A.
Figure 20B:
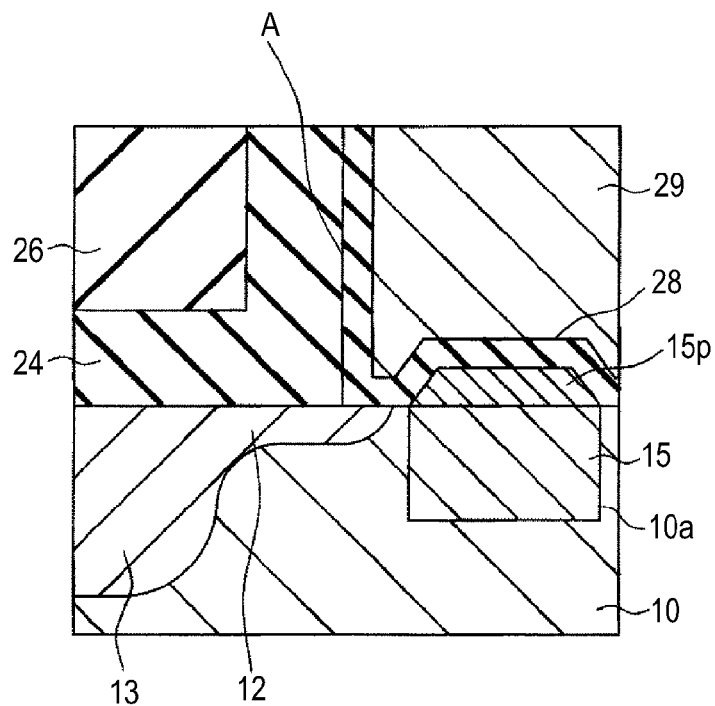

FIG. 20A is a cross-sectional view of a semiconductor device according to the embodiment and FIG. 20B is an enlarged view of a part in the vicinity of the extension region, the gate electrode and the SiGe layer, which is the part of FIG. 20A.

For example, a convex portion 15p in which an upper surface of the SiGe layer 15 protrudes from the surface of the semiconductor substrate 10 is included in the SiGe layer 15, and Ge concentration is increased from a portion of the SiGe layer 15 embedded in the semiconductor substrate 10 toward the direction of the convex portion 15p.

The device has the same structure as the first embodiment except the above.

In the transistor according to the embodiment, the gate electrode is formed with the second width wider than the first width at the region protruding from the forming region of the SiGe layer. Additionally, the transistor is formed so that the depletion layer extending from the junction surface between the extension region included in the source/drain region and the semiconductor substrate does not reach the SiGe layer.

As described above, the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

Particularly, in the transistor according to the embodiment, the potential of the valence band in the convex portion 15p becomes steeper. As a result, carrier speed is accelerated and can be further increased.

As the structure has the convex portion in this case, the channel length is somewhat longer. It is necessary to determine the height of the convex portion to a degree that the improved carrier speed is not cancelled.

[Manufacturing Method of the Semiconductor Device]

Next, a manufacturing method of the semiconductor device according to the embodiment will be explained with reference to the drawings.

Figure 21A:
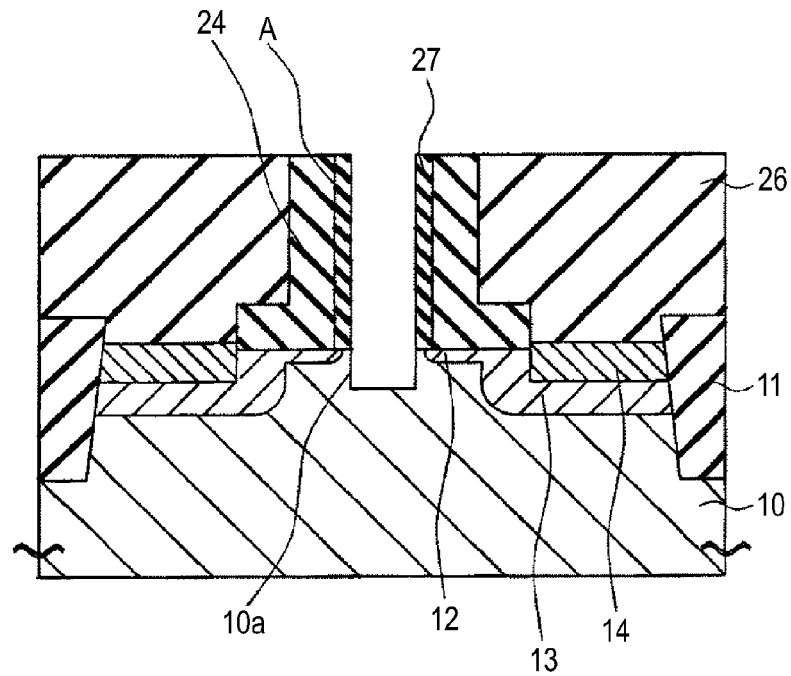
FIGS. 21A and 21B are cross-sectional views showing processes of a manufacturing method of the semiconductor device according to the fifth embodiment of the invention.

First, the processes to FIG. 9B of the first embodiment are performed in the same manner until reaching the structure shown in FIG. 21A.

Figure 21B:
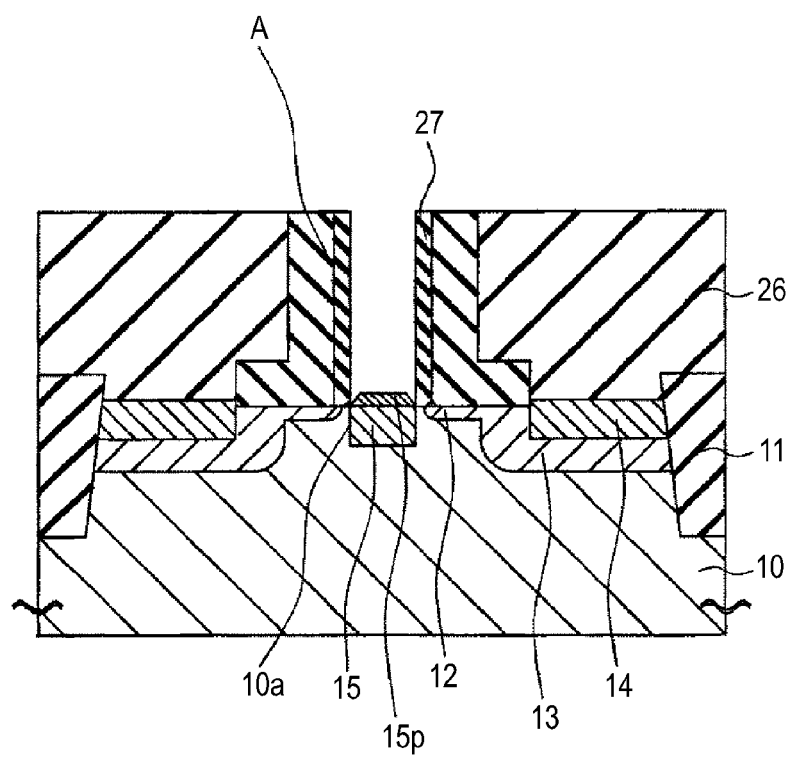

Next, as shown in FIG. 21B, for example, after performing pre-processing by hydrofluoric acid, epitaxial growth is performed to form the SiGe layer 15 by being embedded in the concave portion for embedding the SiGe layer 10a. Moreover, the convex portion 15p made of SiGe is continuously formed.

Here, the SiGe layer can be represented as $Si_{1-x}Ge_x$ (x=0 to 1) in composition, in which Ge concentration can be changed freely. At this time, the epitaxial growth is performed under a condition that Ge concentration is increased toward the upper surface of the SiGe layer 15 and the convex portion 15p. The Ge concentration is increased as carriers flow from the source to the channel center, which can improve carrier mobility.

Processes other than the above are substantially the same as the first embodiment.

According to the manufacturing method of the semiconductor device of the embodiment, the MOS transistor which is capable of realizing improvement of carrier mobility as well as increase of carrier speed in the channel while suppressing junction leakage can be formed in the same manner as the first embodiment.

Sixth Embodiment

[Cross-Sectional structure of a Semiconductor Device]

Figure 22:
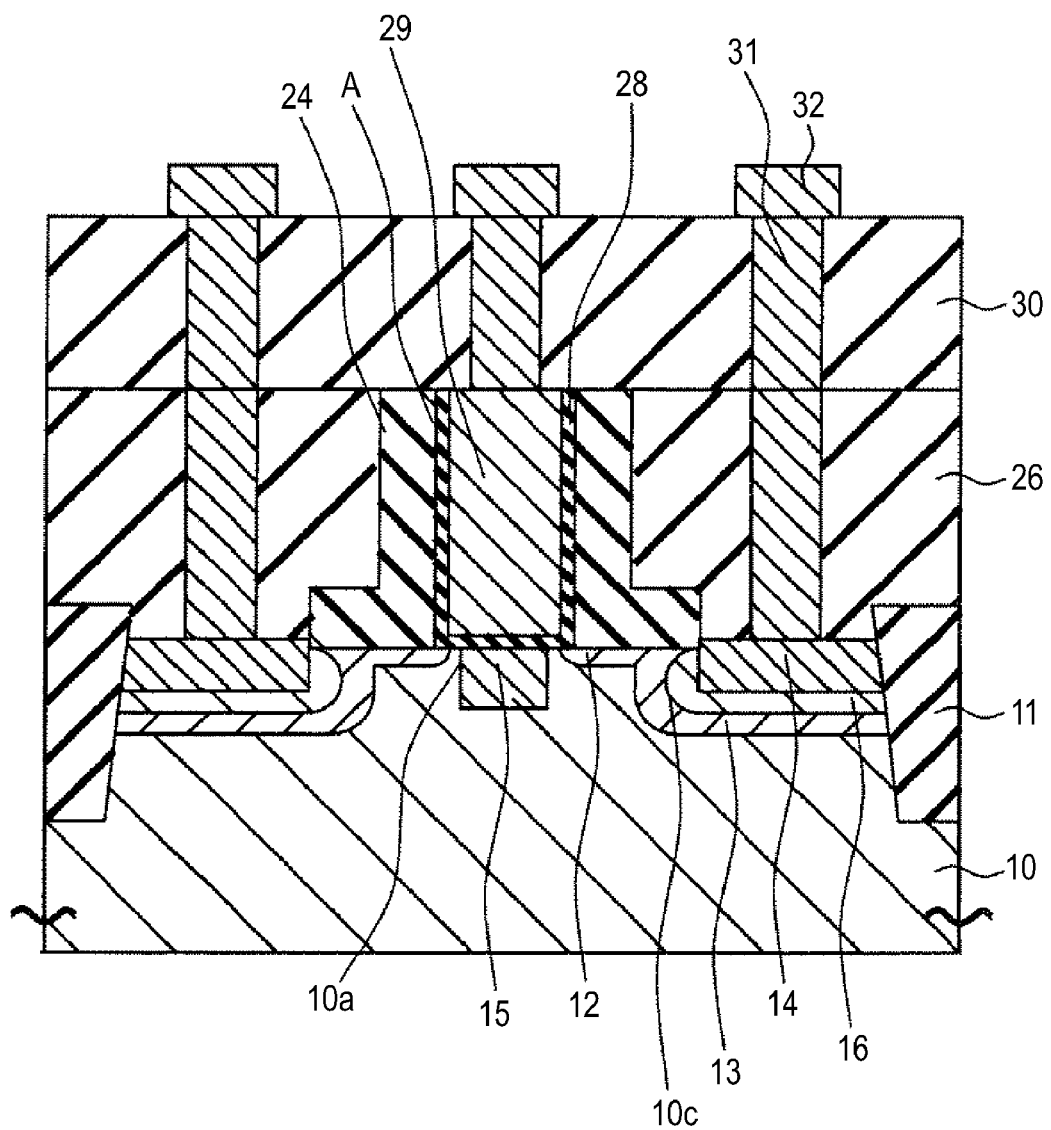
FIG. 22 is a cross-sectional view of a semiconductor device according to a sixth embodiment of the invention.

FIG. 22 is a cross sectional view of a semiconductor device according to the embodiment.

For example, SiGe layers for source/drain 16 are embedded at surface layer portions of the source/drain regions 13.

The refractory metal silicide layers 14 made of NiSi and the like are formed at surface layers of the SiGe layers for source/drain 16.

The device has the same structure as the first embodiment except the above.

In the transistor according to the embodiment, the gate electrode is formed with the second width wider than the first width of the SiGe layer at the region protruding from the forming region of the SiGe layer. Additionally, the transistor is formed so that the depletion layer extending from the junction surface between the extension region included in the source/drain region and the semiconductor substrate does not reach the SiGe layer.

As described above, the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

Particularly, in the transistor according to the embodiment, the SiGe layers for source/drain 16 are included in the source/drain regions, thereby increasing compression stress applied to the SiGe layer 15 and improving the hole carrier mobility.

[Manufacturing Method of the Semiconductor Device]

Next, a manufacturing method of the semiconductor device according to the embodiment will be explained with reference to the drawings.

First, the processes to the process shown in FIG. 5B are performed in the same manner.

Figure 23A:
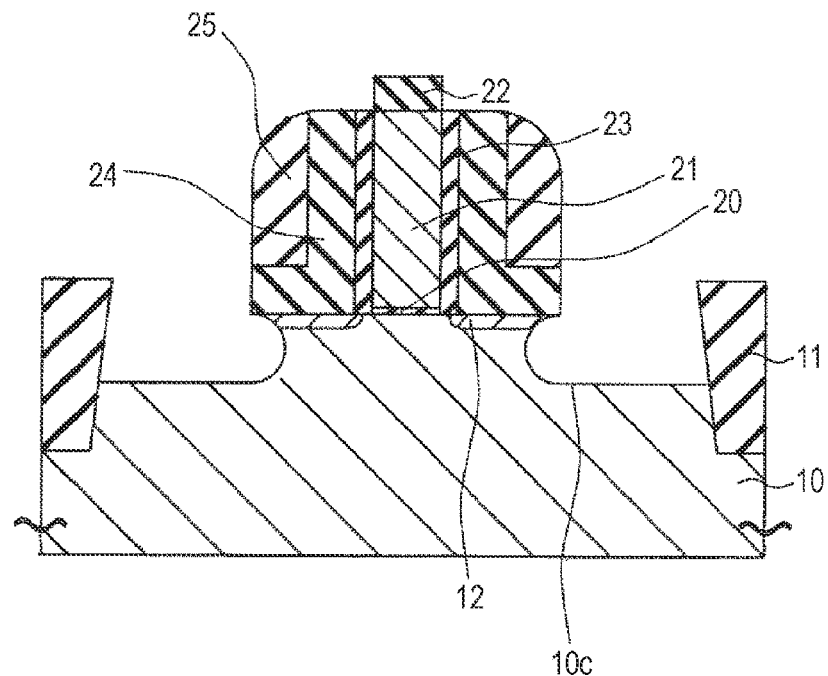
FIGS. 23A and 23B are cross-sectional views showing processes of a manufacturing method of the semiconductor device according to the sixth embodiment of the invention.

Next, as shown in FIG. 23A, for example, concave portions for embedding the SiGe layer for source/drain 10c are formed by etching Si at regions to be source/drain regions from surfaces of the extension regions 12 using sidewall spacers (24, 25) as masks.

Figure 23B:
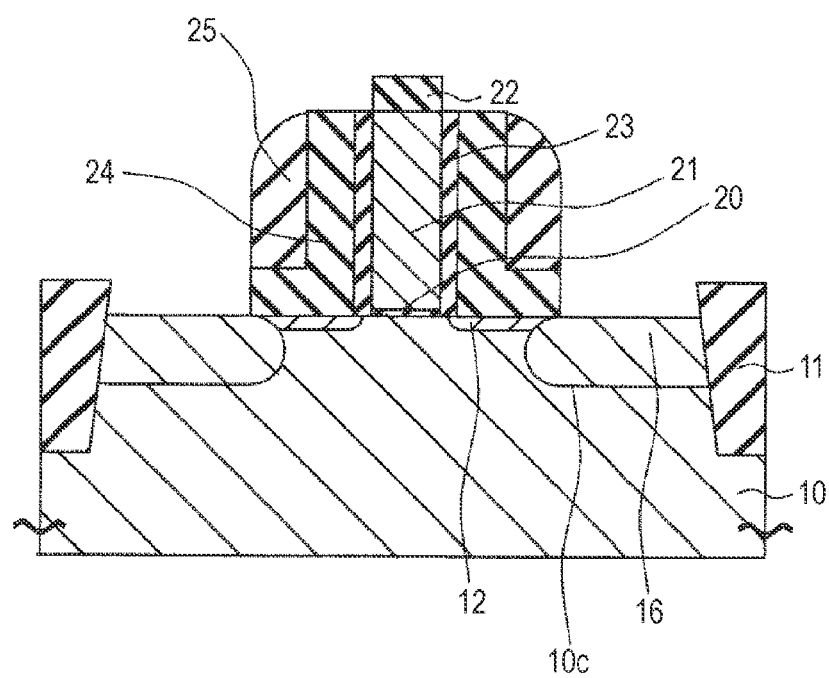

Next, as shown in FIG. 23B, for example, after performing pre-processing by hydrofluoric acid, epitaxial growth is performed to form the SiGe layers for source/drain 16 by being embedded in the concave portions for embedding the SiGe layer for source/drain 10c. The SiGe layers for source/drain 16 can change the Ge concentration freely.

Figure 24A:
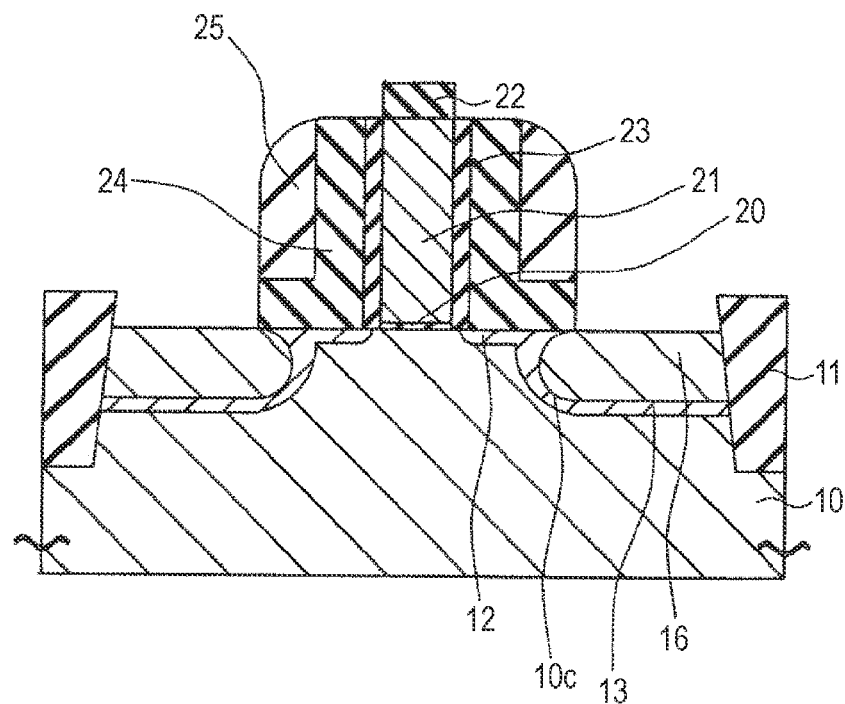
FIGS. 24A and 24B are cross-sectional views showing processes of the manufacturing method of the semiconductor device according to the sixth embodiment of the invention.

Next, as shown in FIG. 24A, for example, an impurity is ion-implanted at the active region by using the sidewall spacers (24, 25), the offset spacers 23 and the hard mask layer 22

(or the dummy gate 21) as masks. As a result of the process, the source/drain regions 13 connected to the extension regions 12 are formed in the semiconductor substrate 10.

After that, heat treatment of spike RTA processing (1030 to 1070° C.) is performed for activating the impurity.

Figure 24B:
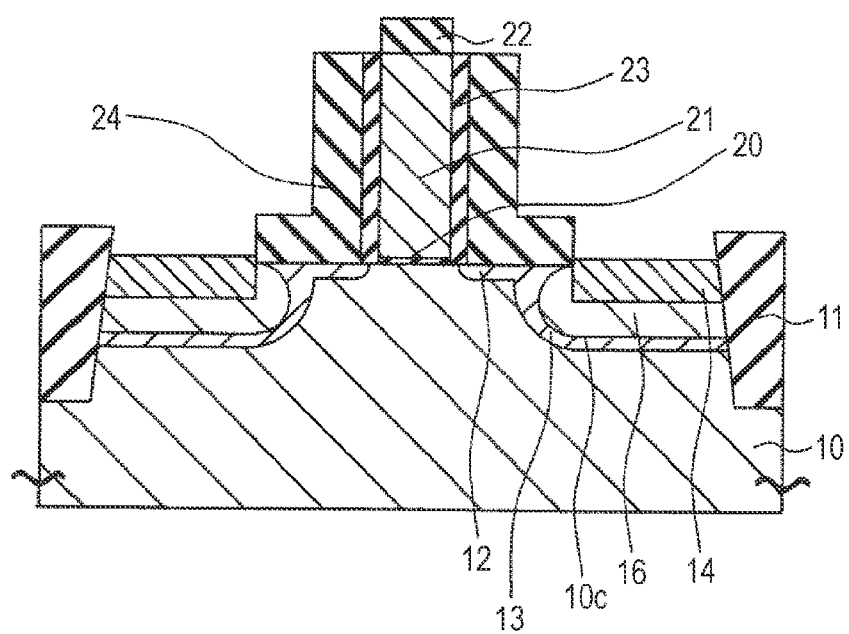

Next, as shown in FIG. 24B, for example, a refractory metal such as nickel, cobalt or platinum is deposited to have a film thickness of 2 to 8 nm on the whole surface by sputtering through pre-processing of diluted hydrofluoric acid (DHF). Next, regions where the refractory metal touches the silicon on surfaces of the source/drain regions are made silicide to form refractory metal silicide layers 14. After that, unreacted refractory metal is removed.

Here, the sidewall spacers 25 made of silicon oxide is removed in the DHF processing.

Processes other than the above are substantially the same as the first embodiment.

According to the manufacturing method of the embodiment, the MOS field effect transistor capable of realizing improvement of carrier mobility as well as increase of carrier speed while suppressing junction leakage can be formed in the same manner as the first embodiment.

Seventh Embodiment

[Cross-Sectional Structure of a Semiconductor Device]

Figure 25:
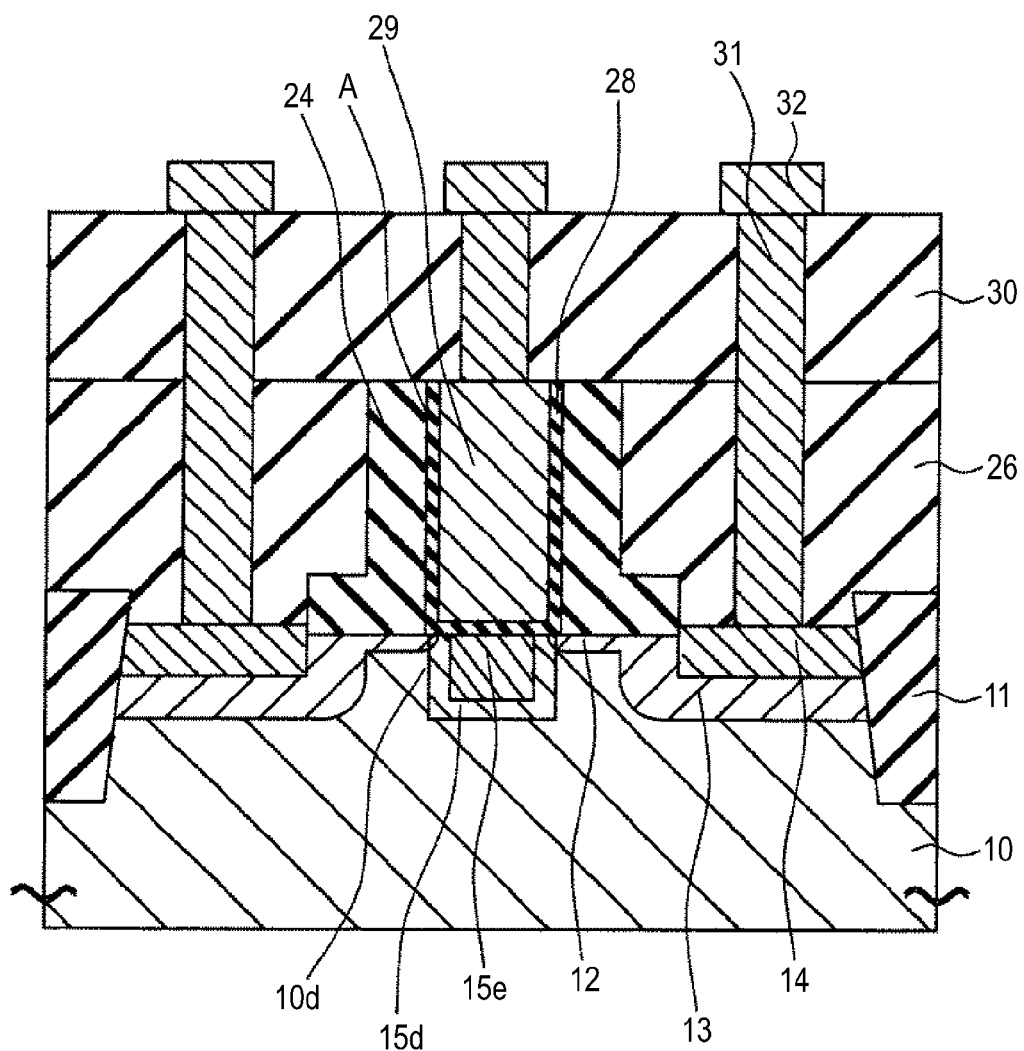
FIG. 25 is a cross-sectional view of a semiconductor device according to a seventh embodiment of the invention.

FIG. 25 is a cross-sectional view of a semiconductor device according to the embodiment.

In a concave portion for embedding the SiGe layer 10d, a Si layer 15d having a given thickness is formed at an inner surface of the concave portion for embedding the SiGe layer, and SiGe layer 15e is formed in the upper layer of the Si layer 15d to have the first width in the channel direction.

The device has the same structure as the first embodiment except the above.

In the transistor according to the embodiment, the gate electrode is formed with the second width wider than the first width at the region protruding from the forming region of the SiGe layer. Additionally, the transistor is formed so that the depletion layer extending from the junction surface between the extension region included in the source/drain region and the semiconductor substrate does not reach the SiGe layer.

As described above, the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

[Manufacturing Method of the Semiconductor Device]

Next, a manufacturing method of the semiconductor device according to the embodiment will be explained with reference to the drawings.

Figure 26A:
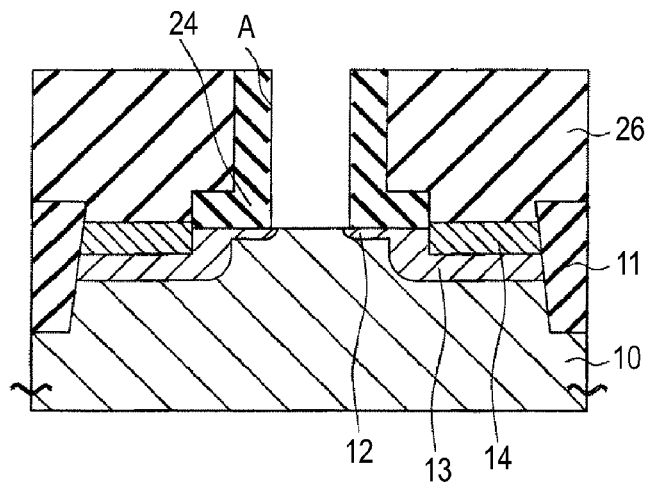
FIGS. 26A to 26C are cross-sectional views showing processes of a manufacturing method of the semiconductor device according to the seventh embodiment of the invention.

First, the processes to FIG. 8B of the first embodiment are performed in the same manner until reaching the structure shown in FIG. 26A.

Figure 26B:
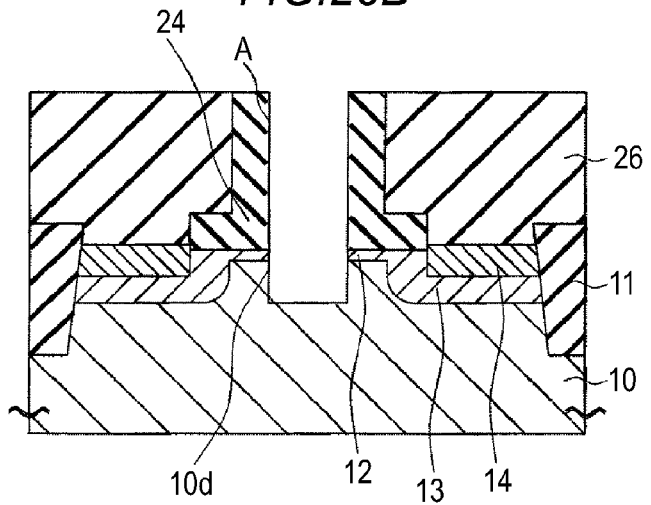

Next, as shown in FIG. 26B, Si in the channel region is etched by using, for example, the sidewall spacers 24 as masks to form the concave portion for embedding the SiGe layer 10d. The embodiment differs from the first embodiment in a point that Si is etched without forming the offset spacers again. The depth of the concave portion for embedding the SiGe layer 10d is approximately 5 to 20 nm.

Figure 26C:
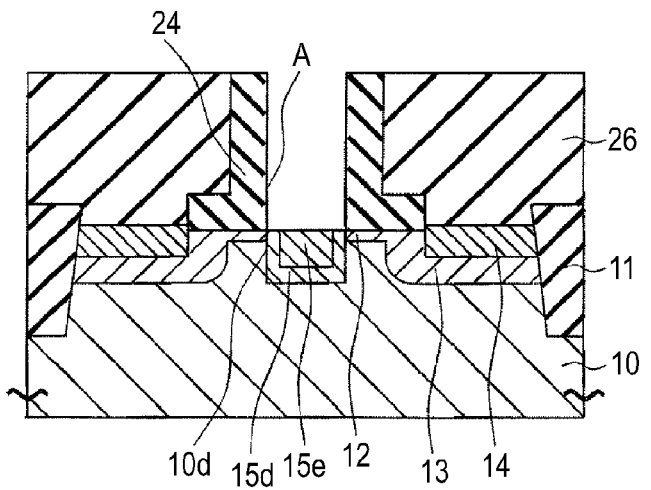

Next, as shown in FIG. 26C, for example, the epitaxial growth is performed after performing pre-processing by hydrofluoric acid and the like.

In this case, the SiGe layer 15e is formed to have the first width in the channel direction after the Si layer 15d having the given thickness is grown at the inner wall of the concave portion for embedding the SiGe layer 10d.

As it is necessary that regions in which the impurity exists at the extension regions are made of Si, Si is grown in the first step of the epitaxial growth. It is necessary that the Si layer 15d is formed to a degree that the impurity at the extension regions is diffused by a heat process in sequential processes, and the thickness of the Si layer 15d is approximately 1 to 3 nm.

The SiGe layer 15e can be represented as $Si_{1-x}Ge_x$ (x=0 to 1) in composition, in which Ge concentration can be changed freely.

Processes other than the above are substantially the same as the first embodiment.

According to the manufacturing method of the semiconductor device, the MOS field effect transistor capable of realizing improvement of carrier mobility as well as increase of carrier speed while suppressing junction leakage can be formed in the same manner as the first embodiment.

Eighth Embodiment

[Cross-Sectional Structure of a Semiconductor Device]

Figure 27:
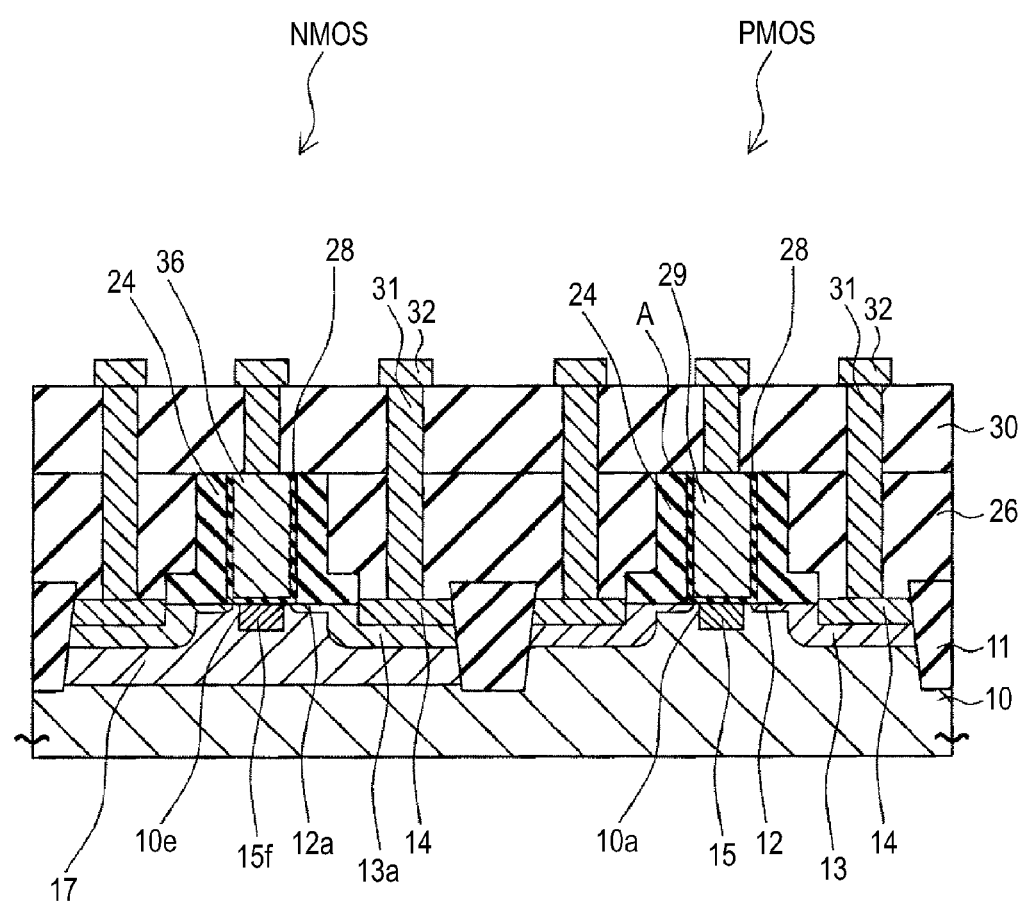
FIG. 27 is a cross sectional view of a semiconductor device according to a eighth embodiment of the invention.

FIG. 27 is a cross-sectional view of a semiconductor device according to the embodiment.

The semiconductor device according to the embodiment has a CMOS structure including a PMOS and a NMOS.

The PMOS has the same structure as the first embodiment.

The NMOS has, for example, the following structure. For example, a p-well 17 is formed on the semiconductor substrate 10 made of an n-type silicon (Si) having a channel forming region element isolated by the element isolation insulating film 11, and an concave portion for embedding the SiGe layer 10e is formed at the channel forming region. An n-type SiGe layer 15f having the first width is embedded in the channel direction.

Additionally, a pair of sidewall spacers 24 made of a silicon nitride film and the like are formed on the semiconductor substrate 10 at regions sandwiching the region of the SiGe layer 15f to be the channel forming region.

For example, a region between the pair of sidewall spacers 24 is a groove for the gate electrode. The gate insulating film 28 made of a so-called High-k film and the like having a dielectric constant higher than silicon oxide such as hafnium oxide or aluminum oxide is formed so as to cover an inner wall surface of the groove for the gate electrode including the bottom thereof.

For example, agate electrode 36 made of metal materials and the like is formed so as to be embedded in the groove for the gate electrode in the upper layer of the gate insulating film 28. The gate electrode 36 is made of a metal selected from groups including tungsten, hafnium, tantalum, titanium, molybdenum, ruthenium, nickel and platinum, an alloy including these metals or a chemical compound of these metals.

Additionally, for example, n-type source/drain regions 13a including n-type extension regions 12a are formed at regions sandwiching the SiGe layer 15f to be the channel forming region including at least parts under the sidewall spacers 24 on the p-well 17.

The refractory metal silicide layers 14 made of NiSi and so on are formed at surface layer portions of the source/drain regions 13a.

In the manner as described above, the NMOS is formed.

The above NMOS is covered with the first interlayer insulating film 26 and the second interlayer insulating film 30 made of silicon oxide in the same manner as the PMOS, opening reaching to the source/drain regions are formed and further, plugs and upper wiring are formed.

In the embodiment, conducting materials forming the gate electrode 36 of the NMOS and the gate electrode 29 of the PMOS are different.

For example, the gate electrode 36 of the NOMS is made of HfSi, and the gate electrode 29 of the PMOS is made of TiN.

The device has the same structure as the first embodiment except the above.

In the transistor according to the embodiment, the gate electrode is formed with the second width wider than the first width at the region protruding from the forming region of the SiGe layer in the PMOS. Additionally, the transistor is formed so that the depletion layer extending from the junction surface between the extension region included in the source/drain region and the semiconductor substrate does not reach the SiGe layer.

The PMOS of the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

[Manufacturing Method of the Semiconductor Device]

Next, a manufacturing method of the semiconductor device according to the embodiment will be explained with reference to the drawings.

Figure 28A:
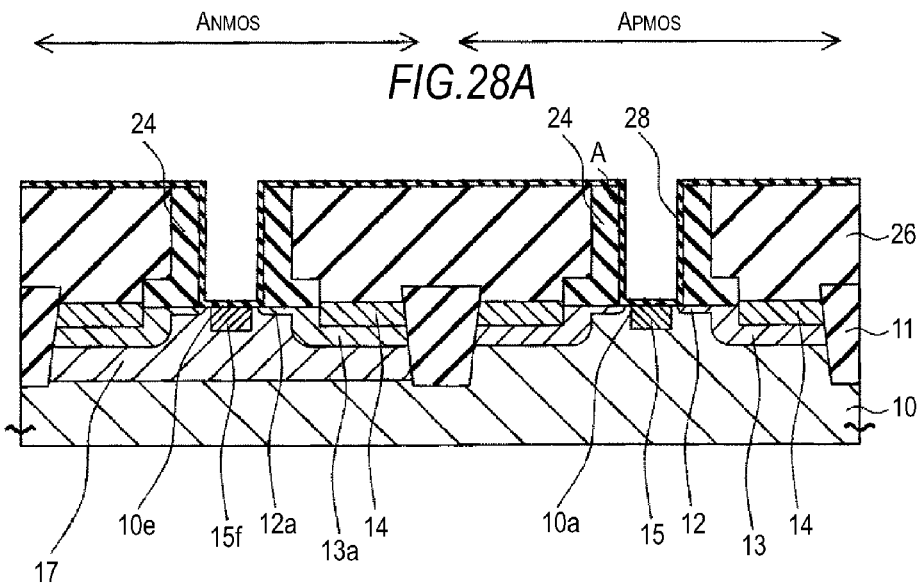
FIGS. 28A and 28B are cross-sectional view showing processes of a manufacturing method of the semiconductor device according to the eighth embodiment of the invention.

First, the processes to FIG. 11A of the first embodiment are performed in the same manner until reaching the structure shown in FIG. 28A in an NMOS forming region $A_{NMOS}$ and a PMOS forming region $A_{PMOS}$.

However, the p-well 17 is formed in the NMOS forming region $A_{NMOS}$ and an n-type impurity is used for ion implantation for forming the extension regions 12a and the source/drain regions 13a.

Figure 28B:
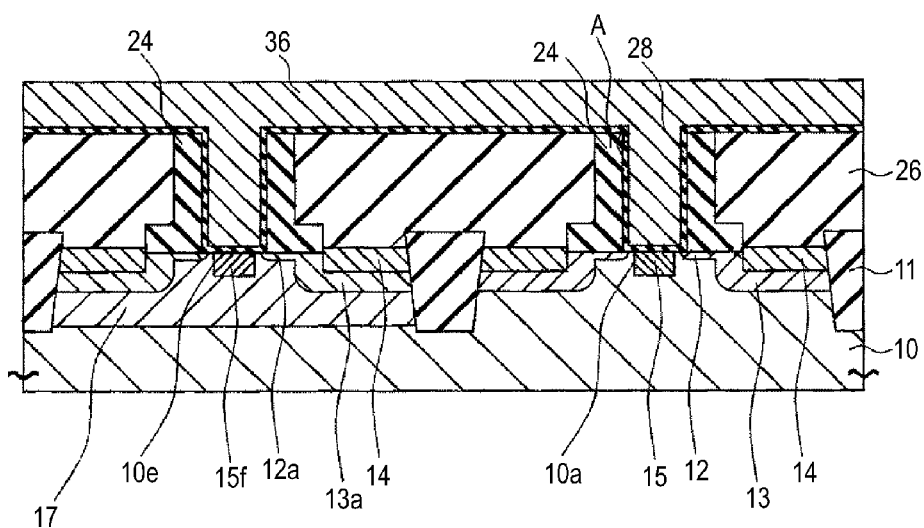

Next, as shown in FIG. 28B, HfSi is deposited so as to fill in the grooves for the gate electrodes in the NMOS forming region $A_{NMOS}$ and the PMOS forming region $A_{PMOS}$ by using, for example, the sputtering method or the CVD method. As a result of the process, the gate electrode 36 for the NMOS is formed.

Figure 29A:
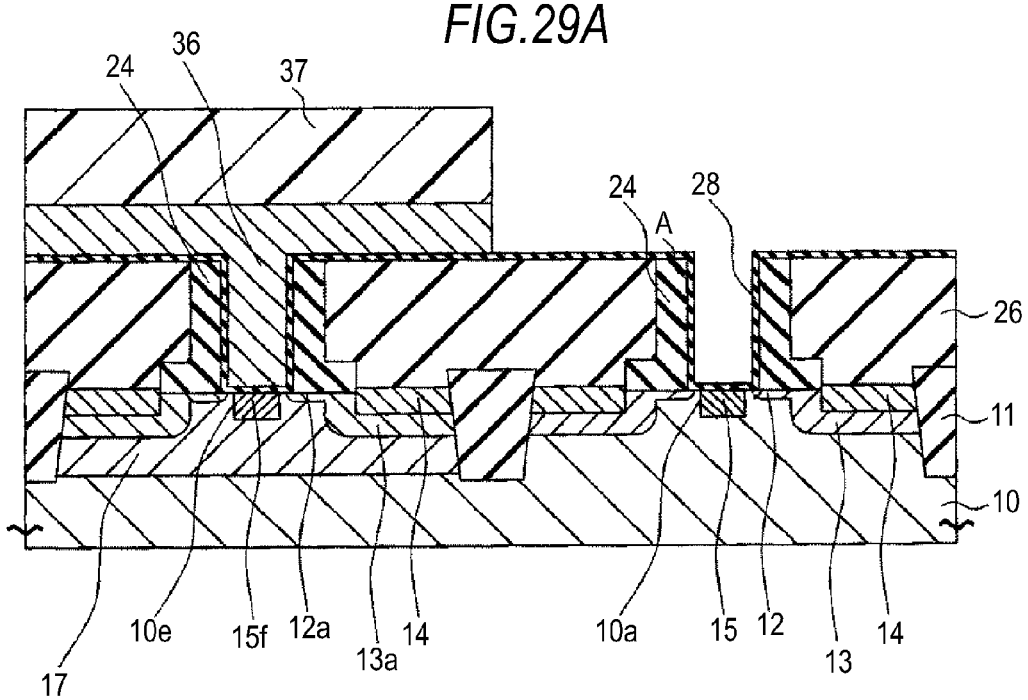
FIGS. 29A and 29B are cross-sectional view showing processes of the manufacturing method of the semiconductor device according to the eighth embodiment of the invention.

Next, as shown in FIG. 29A, a resist film 37 for protecting the NMOS forming region $A_{NMOS}$ and etching is performed to remove the gate electrode 36 on the PMOS forming region $A_{PMOS}$.

Figure 29B:
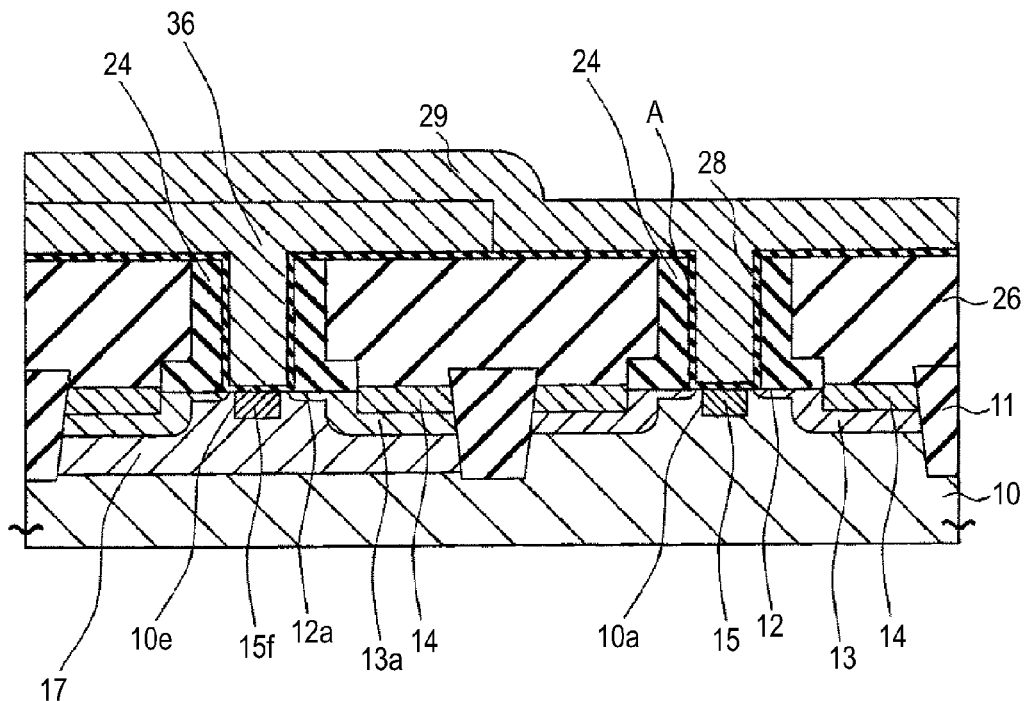

Next, as shown in FIG. 29B, for example, TiN is deposited so as to fill in the groove for the gate electrode in the PMOS forming region $A_{PMOS}$ by using, for example, the sputtering method or the CVD method. As a result of the process, the gate electrode 29 for the PMOS is formed. In the NMOS forming region $A_{NMOS}$, the gate electrode 29 is stacked on the gate electrode 36.

Figure 30A:
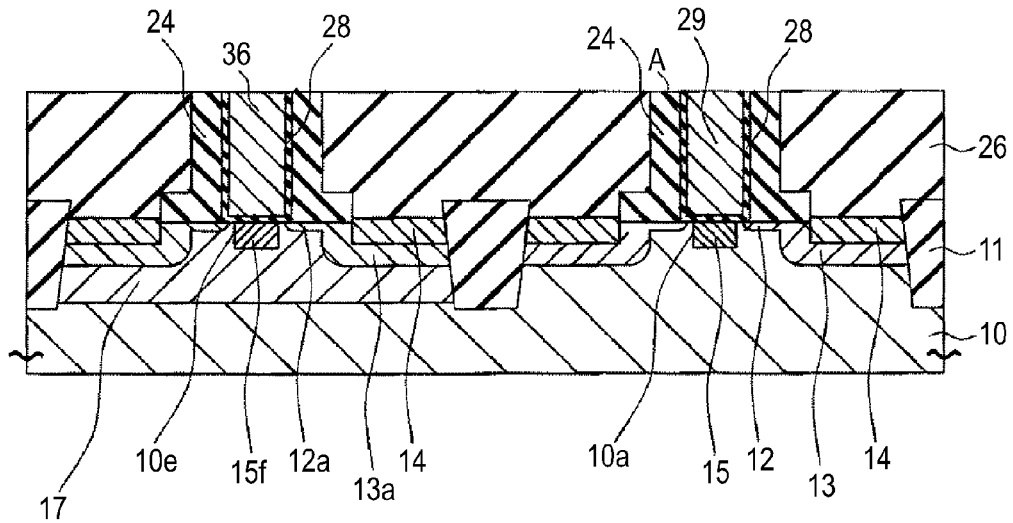
FIGS. 30A and 30B are cross-sectional view showing processes of the manufacturing method of the semiconductor device according to the eighth embodiment of the invention.

Next, as shown in FIG. 30A, for example, the conductive materials to be gate electrodes stacked outside the grooves for gate electrodes are removed by, for example, the CMP processing to form the gate electrodes (29, 36) filled in the grooves for the gate electrodes.

Figure 30B:
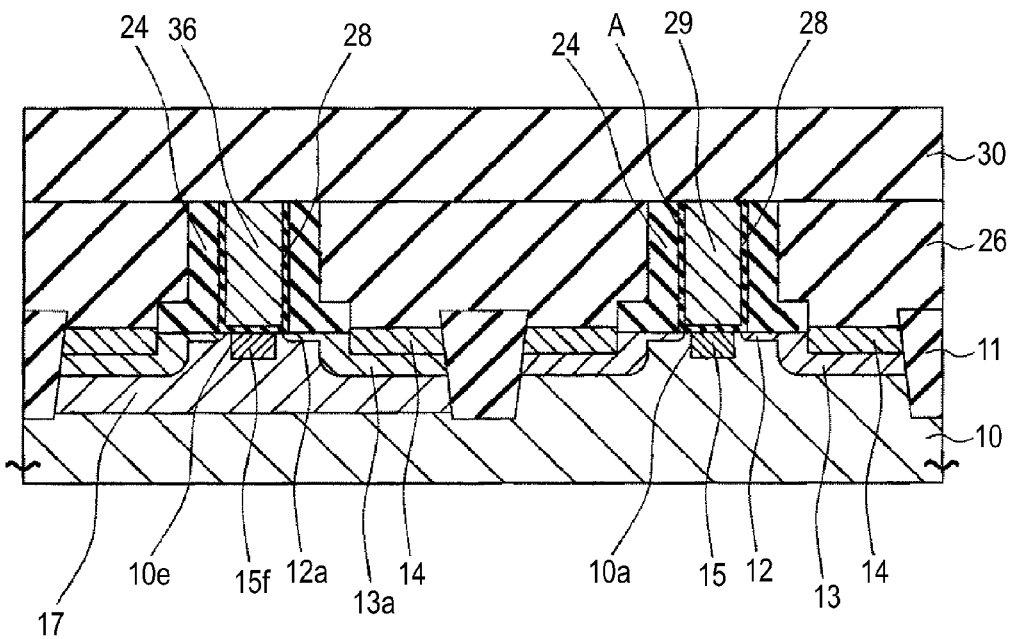

Next, as shown in FIG. 30B, silicon oxide is deposited to have a film thickness of 50 to 100 nm on the whole surface by using, for example, the CVD method to form the second interlayer insulating film 30.

Processes other than the above are substantially the same as the first embodiment.

According to the manufacturing method of the semiconductor device, the MOS field effect transistor capable of realizing improvement of carrier mobility as well as increase of carrier speed in the channel can be formed in the PMOS while suppressing junction leakage in the same manner as the first embodiment.

Ninth Embodiment

[Cross-Sectional View of a Semiconductor Device]

Figure 31:
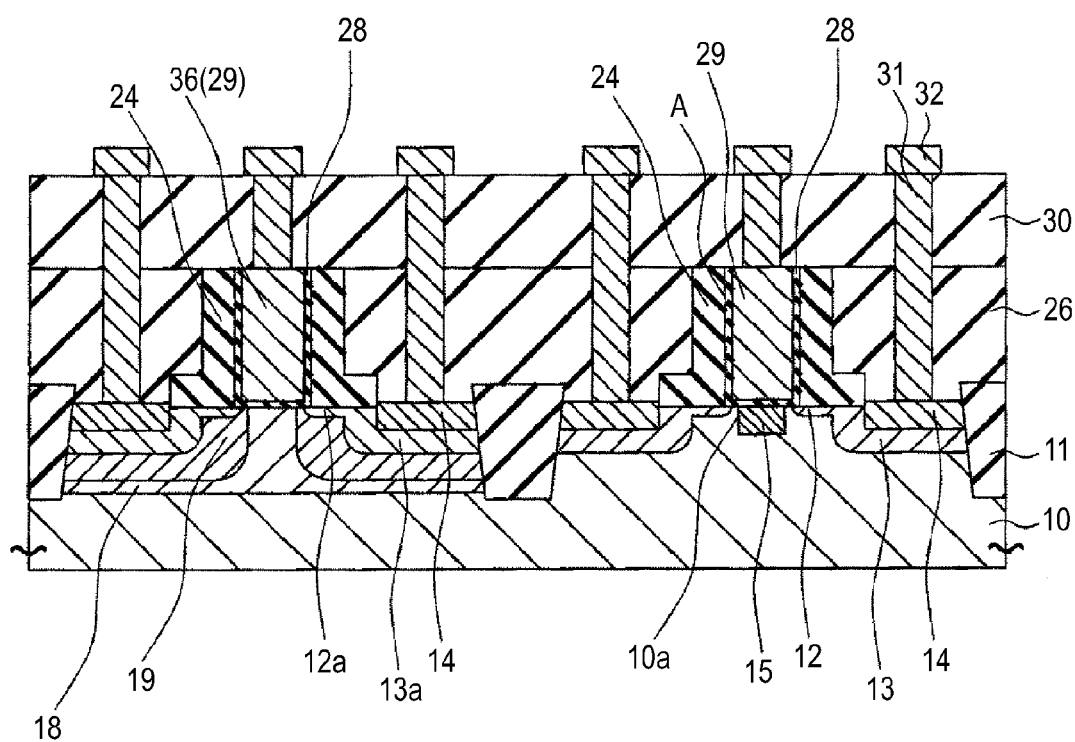
FIG. 31 is a cross-sectional view of a semiconductor device according to a ninth embodiment of the invention.

FIG. 31 is a cross-sectional view of a semiconductor device according to the embodiment.

The semiconductor device according to the embodiment has the CMOS structure including the PMOS and the NMOS.

The PMOS has the same structure as the first embodiment.

The NMOS has, for example, the following structure. For example, a SiGe layer 18 is formed on the semiconductor substrate 10 made of an n-type silicon (Si) having the channel forming region element isolated by the element isolation insulating film 11. The SiGe layer 18 is removed at regions other than the channel forming region of the SiGe layer 18 and a Si layer 19 is formed.

The source/drain regions 13a including the extension regions 12a are formed in the Si layer 19, and the refractory metal silicide layers 14 made of NiSi and the like are formed at surface layer portions of the source/drain regions 13a.

In the manner as described above, the NMOS is formed.

The above NMOS is covered with the first interlayer insulating film 26 and the second interlayer insulating film 30 made of silicon oxide in the same manner as the PMOS, opening reaching to the source/drain regions and the like are formed and further, plugs and upper wiring are formed.

In the embodiment, conducting materials forming the gate electrode 36 of the NMOS and the gate electrode 29 of the PMOS are different.

For example, the gate electrode 36 of the NMOS is made of HfSi, and the gate electrode 29 of the PMOS is made of TiN. The both electrodes may be made of the same gate electrode 29.

The device has the same structure as the first embodiment except the above.

In the transistor according to the embodiment, the gate electrode is formed with the second width wider than the first width at the region protruding from the forming region of the SiGe layer in the PMOS. Additionally, the transistor is formed so that the depletion layer extending from the junction surface between the extension region included in the source/drain region and the semiconductor substrate does not reach the SiGe layer.

The PMOS of the semiconductor device according to the embodiment can realize improvement of carrier mobility as well as increase of carrier speed in the channel while suppressing junction leakage due to the narrow band gap in the MOS field effect transistor in the same manner as the first embodiment. As a result, drive current of the transistor can be improved.

[Manufacturing Method of the Semiconductor Device]

Next, a manufacturing method of the semiconductor device according to the embodiment will be explained with reference to the drawings.

Figure 32A:
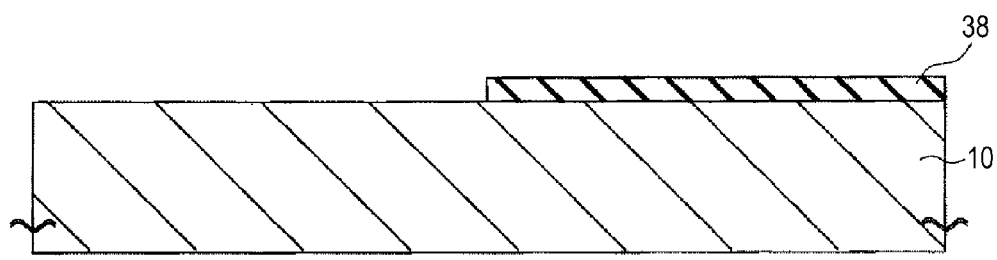
FIGS. 32A to 32C are cross-sectional views showing processes of a manufacturing method of the semiconductor device according to the ninth embodiment of the invention.

First, as shown in FIG. 32A, a silicon nitride film 38 for protecting the PMOS forming region $A_{PMOS}$ is pattern-formed on the semiconductor substrate 10 made of silicon having the NMOS forming region $A_{NMOS}$ and the PMOS forming region $A_{PMOS}$.

Figure 32B:
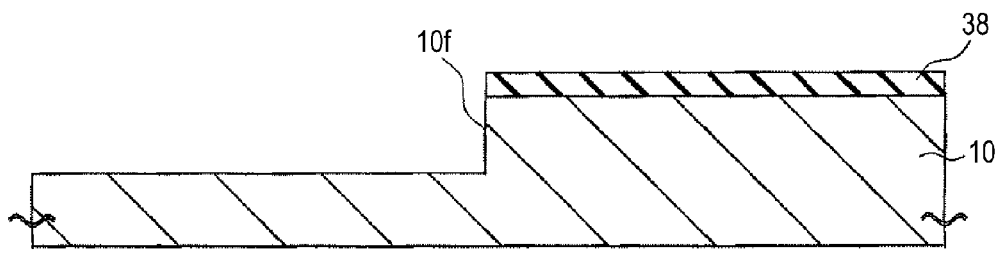

Next, as shown in FIG. 32B, Si is removed by etching to a given depth in the NMOS forming region $A_{NMOS}$ to form a concave portion for the NMOS 10f.

Figure 32C:
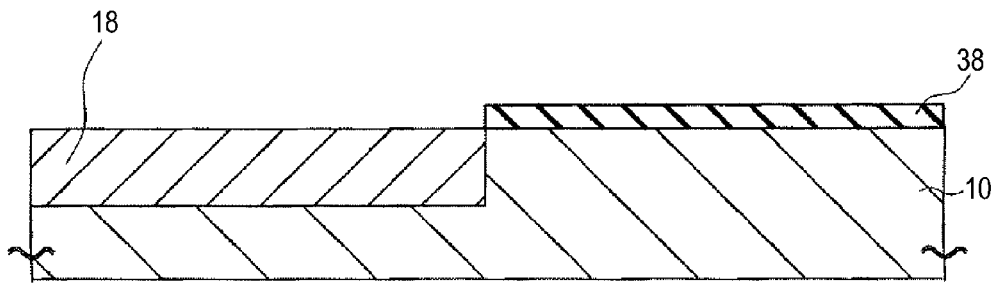

Next, as shown in FIG. 32C, the epitaxial growth is performed to form the SiGe layer 18 in the NMOS forming region $A_{NMOS}$.

After the growth, the surface of the SiGe layer 18 in the NMOS forming region $A_{NMOS}$ is made aligned with the surface of the semiconductor substrate 10 made of Si in the PMOS forming region $A_{PMOS}$ by using the CMP method and the like.

Figure 33A:
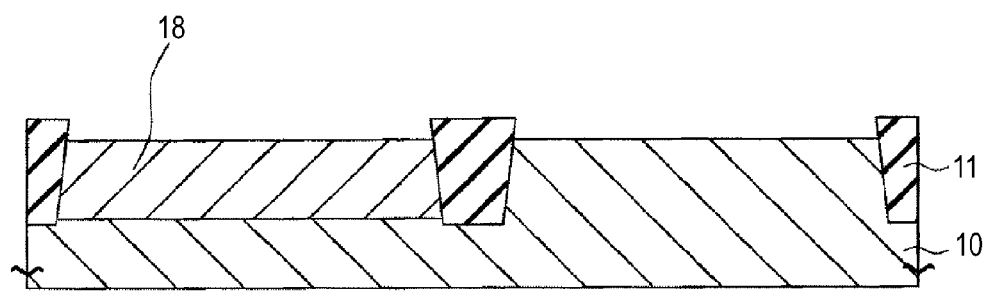
FIGS. 33A and 33B are cross-sectional views showing processes of the manufacturing method of the semiconductor device according to the ninth embodiment of the invention.

Next, as shown in FIG. 33A, the element isolation insulating film 11 is pattern formed to have a thickness of approximately 100 to 200 nm so as to isolate the active region on the semiconductor substrate 10 made of silicon in the NMOS forming region $A_{NMOS}$ and the PMOS forming region $A_{PMOS}$.

Figure 33B:
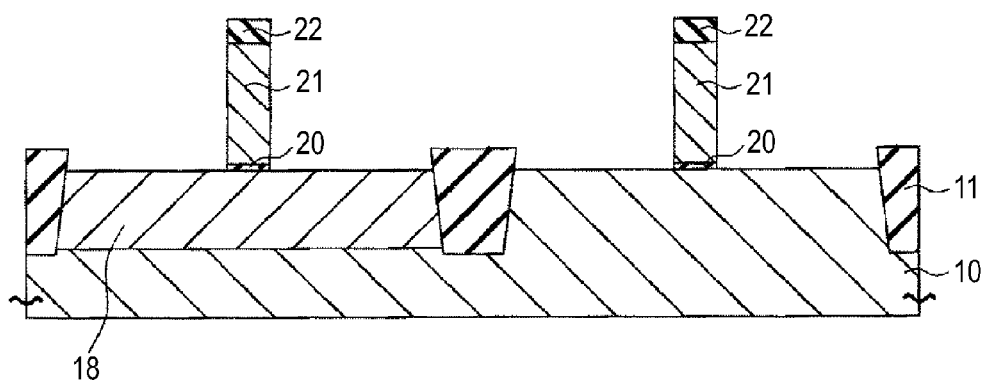

Next, as shown in FIG. 33B, ion implantation for the well and the channel is performed in the NMOS forming region $A_{NMOS}$ and the PMOS forming region $A_{PMOS}$ to thereby form the dummy gate insulating film 20, the dummy gate electrode 21 and the hard mask 22.

Figure 34A:
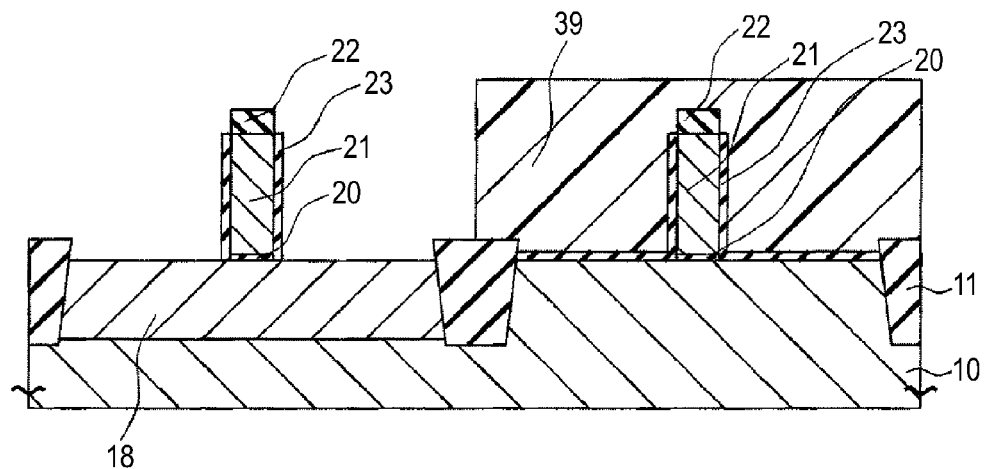
FIGS. 34A and 34B are cross-sectional views showing processes of the manufacturing method of the semiconductor device according to the ninth embodiment of the invention.

Next, as shown in FIG. 34A, silicon nitride, silicon nitride including boron (SiBN) or silicon nitride including carbon (SiCN) is deposited to have a thickness of 4 to 8 nm on the whole surface by, for example, the CVD method. Next, a resist film 39 for protecting the PMOS forming region $A_{PMOS}$ is formed and etched back in the NMOS forming region $A_{NMOS}$.

As a result of the process, the offset spacers 23 are formed at both sides of the dummy gate electrode 21 in the NMOS forming region $A_{NMOS}$.

The reason of using the silicon nitride, silicon nitride including boron or silicon nitride including carbon is to secure selectivity as there is the epitaxial growth process after that.

Figure 34B:
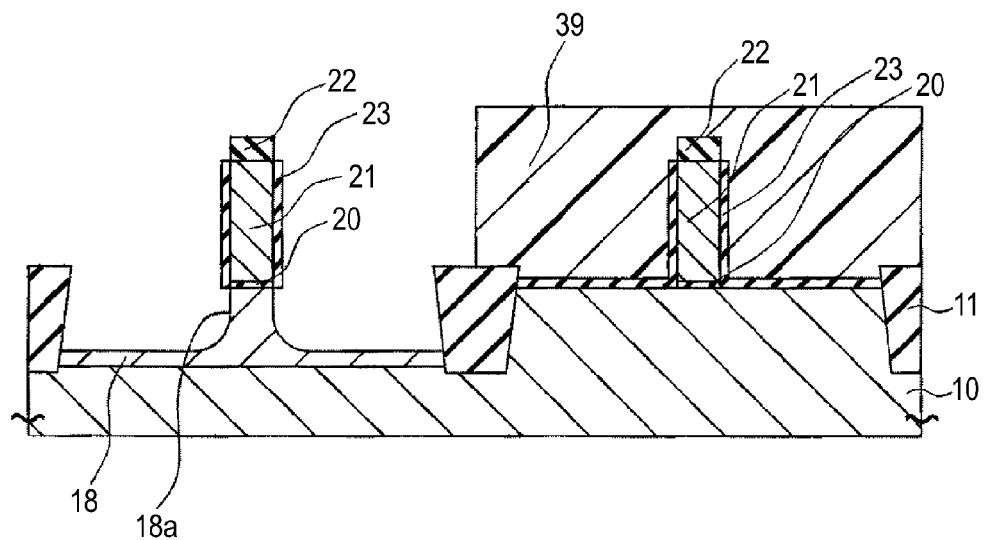

Next, as shown in FIG. 34B, the SiGe layer 18 at regions to be the source/drain regions is etched from the surface of the SiGe layer 18 using the resist film 39, the hard mask 22 and the offset spacers 23 as masks in the NMOS forming region $A_{NMOS}$. As a result of the process, concave portions for the Si layer for source/drain 18a are formed.

Next, the resist film 39 is removed and the epitaxial growth is performed after performing pre-processing by, for example, hydrofluoric acid and the like to form the Si layer 19 for the source/drain so as to be filled in the concave portions for the Si layer for source/drain 18a in the NMOS forming region $A_{NMOS}$.

Figure 35A:
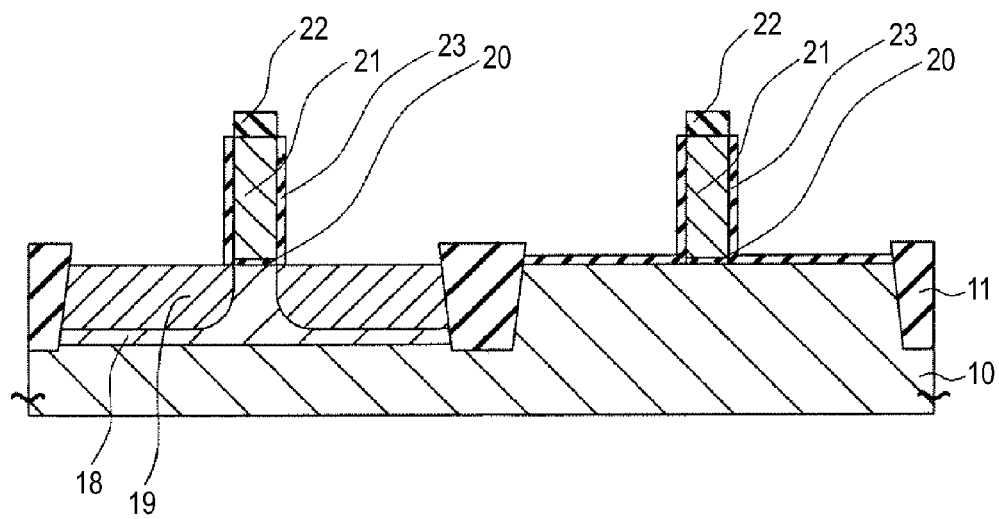
FIGS. 35A and 35B are cross-sectional views showing processes of the manufacturing method of the semiconductor device according to the ninth embodiment of the invention.
Figure 35B:
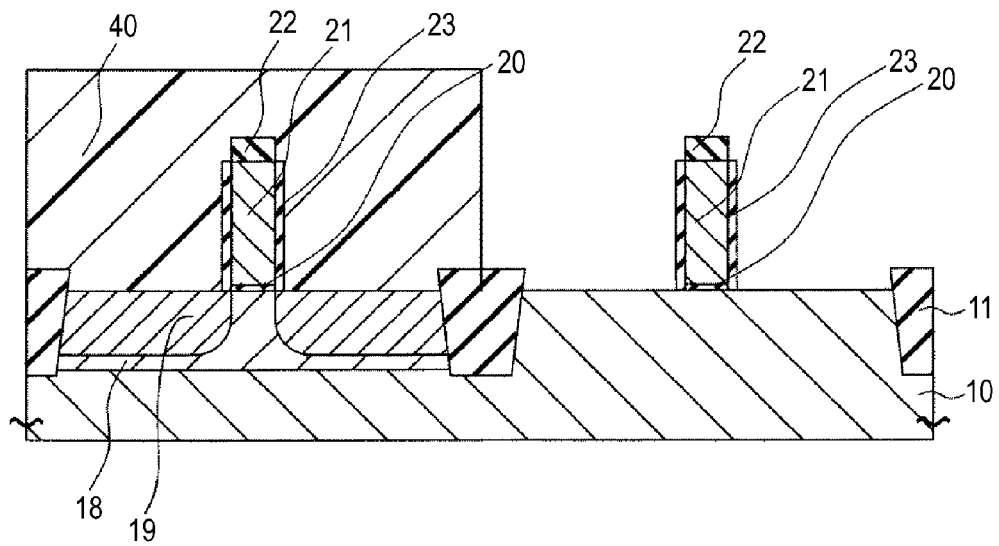

Next, as shown in FIG. 35B, a resist film 40 for protecting the NMOS forming region $A_{NMOS}$ is formed and etched back in the PMOS forming region $A_{PMOS}$.

As a result of the process, the offset spacers 23 are formed at both sides of the dummy gate electrode 21 in the PMOS forming region $A_{PMOS}$.

Processes after that are the same as the first embodiment and the eighth embodiment, and processes other than the above are substantially performed in the same manner as the first embodiment to thereby manufacture the semiconductor device shown in FIG. 31.

According to the manufacturing method of the semiconductor device, the MOS field effect transistor capable of realizing improvement of carrier mobility as well as increase of carrier speed in the channel can be formed in the PMOS while suppressing junction leakage in the same manner as the first embodiment.

The invention is not limited to the above embodiments. For example, in the first to seventh embodiments, only the PMOS is shown on the drawings, however, the CMOS semiconductor device further including the NMOS can be applied.

Additionally, various modifications can be made within a scope not departing from the gist of the invention.

The present application contains subject matter related to that disclosed in Japanese Priority Patent Application JP 2009-193353 filed in the Japan Patent Office on Aug. 24, 2009, the entire contents of which is hereby incorporated by reference.

What is claimed is:

1. A semiconductor device comprising:
   a semiconductor substrate having a channel formed in the semiconductor substrate, the channel filled with an SiGe layer, the SiGe layer having a first width in a channel direction;
   gate insulating film formed on the channel;
   a gate electrode formed on the gate insulating film and having a region protruding from a forming region of the SiGe layer with a second width wider than the first width; and
   source/drain regions having extension regions on and extending laterally along the semiconductor substrate from the source/drain regions to sandwich the channel and form a field effect transistor,
   wherein,
   the extension regions are spaced from the SiGe layer by the substrate so that a depletion layer extending from a junction surface between the extension region and the semiconductor substrate does not reach the SiGe layer.

2. The semiconductor device according to claim 1, wherein the extension regions have overlap regions extending beneath the gate electrode.

3. The semiconductor device according to claim 1, wherein a
   width in the channel direction of the SiGe layer becomes wider as
   a depth from a surface of the semiconductor device becomes deeper.

4. The semiconductor device according to claim 1, wherein Ge concentration increases from an end portion on the side of the source/drain regions toward the central direction of the SiGe layer in the SiGe layer.

5. The semiconductor device according to claim 1, wherein a convex portion in which an upper surface of the SiGe layer protrudes from the surface of the semiconductor substrate is included and Ge concentration is increased from a portion embedded in the semiconductor substrate toward the direction of the convex portion in the SiGe layer.

6. The semiconductor device according to claim 1, wherein SiGe layers for source/drain are embedded at surface layer portions of the source/drain regions.

7. A manufacturing method of a semiconductor device comprising the steps of:
   forming a dummy gate insulating film and a dummy gate electrode on a semiconductor substrate including a channel forming region;
   forming offset spacers at both sides of the dummy gate electrode;
   forming extension regions on the semiconductor substrate by using the offset spacers and the dummy gate electrode as masks;
   forming sidewall spacers at both sides of the offset spacers;
   forming source/drain regions on the semiconductor substrate by using the sidewall spacers, the offset spacers and the dummy gate electrode as masks;

forming an insulating film covering the dummy gate electrode;

removing the insulating film until the dummy gate electrode is exposed from an upper surface of the insulating film;

forming a groove for an gate electrode by removing the dummy gate electrode and the dummy gate insulating film;

forming a concave portion for embedding a SiGe layer on a surface of the semiconductor substrate at a bottom of the groove for the gate electrode;

forming the SiGe layer having a first width in a channel direction in the concave portion for embedding the SiGe layer;

removing the offset spacers;

forming a gate insulating film on the SiGe layer at the bottom of the groove for the gate electrode from which the offset spacers were removed; and forming the gate electrode having a second width wider than the first width on the gate insulating film as to fill in the groove for the gate electrode, thereby forming a field effect transistor, wherein, in the step of forming the SiGe layer, the extension region and the SiGe layer are formed to be apart from each other so that a depletion layer extending from a junction surface between the extension region and the semiconductor substrate does not reach the SiGe layer.

8. The manufacturing method of the semiconductor device according to claim 7, wherein the concave portion for embedding the SiGe layer is formed at a region between the offset spacers using the offset spacers as masks in the step of forming the concave portion for embedding the SiGe layer.

9. The manufacturing method of the semiconductor device according to claim 7, wherein:

the offset spacers are removed before the step of forming the concave portion for embedding the SiGe layer, the concave portion for embedding the SiGe layer is formed at a region between the sidewall spacers using the sidewall spacers as masks in the step of forming the concave portion for embedding the SiGe layer, and the SiGe layer is formed to have the first width in the channel direction after a SiGe layer is grown at an inner wall of the concave portion for embedding the SiGe layer to have a given thickness in the step of forming the SiGe layer.

10. The manufacturing method of the semiconductor device according to claim 7, wherein the extension regions are formed so as to include overlap regions entering beneath the gate electrode in the step of forming the extension regions.

11. The manufacturing method of the semiconductor device according to claim 7, wherein:

the concave portion is formed so as to have a region in which the width in the channel direction becomes wider as the depth from the surface of the semiconductor substrate becomes deeper in the step of forming the concave portion for embedding the SiGe layer, and the SiGe layer is formed so as to have a region in which the width of the SiGe layer in the channel direction becomes wider as the depth from the semiconductor substrate becomes deeper in the step of forming the SiGe layer.

12. The manufacturing method of the semiconductor device according to claim 7, wherein, the SiGe layer is formed so that Ge concentration is increased from an end portion on the side of the source/drain regions toward the central direction of the SiGe layer in the step of forming the SiGe layer.

13. The manufacturing method of the semiconductor device according to claim 7, wherein a convex portion in which an upper surface of the SiGe layer protrudes from the surface of the semiconductor substrate is formed and the SiGe layer is formed so that Ge concentration is increased from a portion embedded in the semiconductor substrate toward the direction of the convex portion in the step of forming the SiGe layer.

14. The manufacturing method of the semiconductor device according to claim 7, further comprising the step of:

forming SiGe layers for source/drain at surface layer portions of the source/drain regions by being embedded therein.

15. A manufacturing method of the semiconductor device comprising the steps of:

forming a semiconductor substrate;

forming source/drain regions including extension regions, the extension regions extending laterally along the semiconductor substrate from the source/drain regions to sandwich a channel formed in the semiconductor substrate;

forming a SiGe layer in the channel, the SiGe layer having a first width in formed in a channel direction;

forming a gate insulating film on the channel; and forming a gate electrode having a second width wider than the first width on the gate insulating film, thereby forming a field effect transistor, wherein, in the step of forming the SiGe layer, the extension region and the SiGe layer are spaced from each other by the substrate so that a depletion layer extending from a junction surface between the extension region and the semiconductor substrate does not reach the SiGe layer.

* * * * *